(12) United States Patent
Furuse et al.

(10) Patent No.: US 6,737,287 B1
(45) Date of Patent: May 18, 2004

(54) INK USED FOR INK JET, AND METHODS FOR MANUFACTURING CONDUCTIVE FILM, ELECTRON-EMITTING DEVICE, ELECTRON SOURCE AND IMAGE-FORMING APPARATUS

(75) Inventors: Tsuyoshi Furuse, Atsugi (JP); Yasuko Tomida, Atsugi (JP); Makoto Kojima, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/493,261

(22) Filed: Jan. 28, 2000

(30) Foreign Application Priority Data

| Feb. 17, 1999 | (JP) | ................................. 11-037957 |
| Feb. 22, 1999 | (JP) | ................................. 11-042559 |
| Feb. 22, 1999 | (JP) | ................................. 11-043742 |
| Feb. 25, 1999 | (JP) | ................................. 11-048497 |
| Jan. 16, 2000 | (JP) | ................................. 2000-016529 |

(51) Int. Cl.$^7$ .................................................. H01L 21/00
(52) U.S. Cl. ........................ 438/21; 438/661; 427/123; 427/443.1; 347/55
(58) Field of Search ...................... 438/21, 661, 660; 427/123, 443.1, 443.2, 430.1, 437; 347/55, 95, 100

(56) References Cited

U.S. PATENT DOCUMENTS 3,904,783 A 9/1975 Nara et al.

(List continued on next page.)

FOREIGN PATENT DOCUMENTS

| JP | 6143551    | * | 5/1994  |
| JP | 74038916   | * | 5/1994  |
| JP | 8-55560    |   | 2/1996  |
| JP | 8-171850   |   | 7/1996  |
| JP | 8-264112   |   | 10/1996 |
| JP | 8-277294   |   | 10/1996 |
| JP | 9-069334   |   | 3/1997  |
| JP | 9-245623   |   | 9/1997  |
| JP | 9-245625   |   | 9/1997  |
| JP | 10-12136   |   | 1/1998  |
| JP | 10-326559  |   | 12/1998 |

OTHER PUBLICATIONS

IBM Tech. Discl. Bull. VOl. 22, No. 8A, pp. 3301–3302, Jan. 1980.*

(List continued on next page.)

*Primary Examiner*—Caridad Everhart
(74) *Attorney, Agent, or Firm*—Fitzpatrick, Cella, Harper & Scinto

(57) ABSTRACT

It is an object of the present invention to manufacture a conductive film with a small shape fluctuation at a high stability and a high reproducibility by using the ink jet system. It is another object of the present invention to provide an electron-emitting device having a preferable electron-emitting characteristic, an electron source in which a plurality of preferable electron-emitting devices having a high uniformity are arranged, and an image-forming apparatus having a high uniformity and a preferable display quality. It is still another object of the present invention to provide inexpensive electron-emitting device, electron source, and image-forming apparatus at a high yield.

The present invention is characterized by providing an electron-emitting-device manufacturing method comprising the steps of supplying a liquid containing a conductive-film-forming material so as to connect a pair of electrodes arranged on a substrate each other, forming a conductive film by heating the substrate to which the liquid is supplied and forming an electron-emitting portion by applying a voltage between the electrodes, wherein the liquid uses a solvent containing nitrogen as a main solvent.

57 Claims, 14 Drawing Sheets

U.S. PATENT DOCUMENTS

| | | | |
|---|---|---|---|
| 4,962,088 A | * 10/1990 | Micheli et al. | 505/1 |
| 5,139,818 A | * 8/1992 | Mance | 427/54.1 |
| 5,149,854 A | * 9/1992 | Nappier | 556/49 |
| 5,238,702 A | * 8/1993 | Giesecke et al. | 427/78 |
| 5,259,992 A | * 11/1993 | Bennett | 252/518 |
| 5,882,722 A | * 3/1999 | Kydd | 427/123 |
| 5,894,064 A | * 4/1999 | Hampden-Smith et al. | 438/3 |
| 5,948,232 A | * 9/1999 | Murphy et al. | 205/122 |
| 5,977,207 A | * 11/1999 | Yui et al. | 523/160 |
| 6,050,677 A | 4/2000 | Desie | |
| 6,063,453 A | 5/2000 | Tomida et al. | 427/532 |
| 6,126,740 A | * 10/2000 | Schulz et al. | 117/4 |
| 6,613,399 B2 | 9/2003 | Miyamoto et al. | 427/558 |

OTHER PUBLICATIONS

C.A. Spindt et al., "Physical Properties of Thin–film Field Emission Cathodes with Molybdenum Cones", J. Applied Physics, vol. 47, No. 12, Dec. 1976, pp. 5248–5263.

C.A. Mead, "Operation of Tunnel–Emission Devices," J. Applied Physics, vol. 32, No. 4, Apr. 1961, pp. 646–652.

W.P. Dyke et al., "Field Emission", Advances in Electronics and Electron Physics, vol. VIII, 1956, pp. 89–185.

M. Elinson, et al. "The Emission of Hot Electrons and the Field Emissions of Electrons From Tin Oxide", Radio Engineering and Electronic Physics, Jul. 1965, pp. 1290–1296.

G. Dittmer, "Electrical Conduction and Electron Emission of Discontinuous Thin Films", Thin Solid Films, 9, 1972, pp. 317–328.

M. Hartwell et al., "Strong Electron Emission From Patterned Tin–Indium Oxide Films", IEDM, 1975, pp. 519–521.

H. Araki, et al., "Electroforming and Electron Emission of Carbon Thin Films", Journal of the Vacuum Soc. of Japan, vol. 26, No. 1, 1983, pp. 22–29 (with English Abstract on p. 22).

* cited by examiner

INK USED FOR INK JET, AND METHODS FOR MANUFACTURING CONDUCTIVE FILM, ELECTRON-EMITTING DEVICE, ELECTRON SOURCE AND IMAGE-FORMING APPARATUS

BACKGROUND OF THE INVENTION

1. Field of the Invention

The present invention relates to ink used for ink jet and methods for manufacturing a conductive film, an electron-emitting device, an electron source using the electron-emitting device, and an image-forming apparatus using the electron source.

2. Related Background Art

A conventional electron-emitting device is roughly divided into two types such as a thermionic-cathode and a cold-cathode. The cold-cathode includes the field emission type (hereafter referred to as FE type), the metal/insulating-layer/metal type (hereafter referred to as MIM type), and the surface conduction type.

An example of the FE-type electron-emitting device is disclosed in W. P. Dyke and W. W. Dolan, "Field Emission," Advance in Electron Physics, 8, 89 (1956) or C. A. Spindt, "Physical Properties of thin-film field emission cathodes with molybdenum cones," J. Appl. Phys., 47, 5248 (1976).

An example of the MIM-type electron-emitting device is disclosed in C. A. Mead, "Operation of Tunnel-Emission Devices," J. Appl. Phys., 32, 646 (1961).

An example of the surface-conduction-type electron-emitting device is disclosed in M. I. Elinson, Radio Eng. Electron Phys., 10, 1290 (1965).

A surface-conduction-type electron-emitting device uses a phenomenon in which electron emission occurs in a small-area thin film formed on a substrate by supplying current to the film in parallel with the film surface. As the surface-conduction-type electron-emitting device, the following are reported: device using an $SnO_2$ film invented by the above described M. I. Elinson, device using an Au thin film {G. Dittmer: "Thin Solid Films," 9, 317 (1972)}, device using an $In_2O_3/SnO_2$ film, {M. Harwell and C. G. Fonstad: "IEEE Trans. ED Conf.," 519 (1975)}, and device using a carbon thin film {Hisashi Araki et al: Vacuum, Vol. 26, No. 1, p. 22 (1983).

As an example of these surface-conduction-type electron-emitting devices, the Hartwell's device configuration described above is schematically shown in FIG. 10. In FIG. 10, reference numeral 1 denotes a substrate. Reference numeral 4 denotes a conductive film that is configured by a metal-oxide thin film or the like formed on an H-shaped pattern on which an electron-emitting region 5 is formed through energization process.

FIG. 11A shows a schematic top view of the surface-conduction-type electron-emitting device disclosed in Japanese Patent Application Laid-Open No. 8-264112. FIG. 11B is a schematic sectional view of the device in FIG. 11A. In FIGS. 11A and 11B, reference numeral 1 denotes a substrate, 2 and 3 denote electrodes, 4 denotes a conductive film, 5 denotes an electron-emitting portion, 6 denotes a second gap, 7 denotes a first gap, and 10 denotes a carbon film. A method for manufacturing the device will be described below by referring to FIGS. 12A to 12D. First, electrodes 2 and 3 are formed on a substrate 1 (FIG. 12A). Then, a conductive film 4 for connecting the electrodes 2 and 3 each other is formed (FIG. 12B). Then, the so-called "energization" for supplying a current is applied to the conductive film 4 to form a second gap 6 (FIG. 12C). Then, a voltage is applied between the electrodes 2 and 3 in an atmosphere containing a carbon compound to form a carbon film 10 and an electron-emitting portion 5 (FIG. 12D).

Then, it is attempted to arrange and form the above described electron-emitting devices on a substrate such as glass or the like and use them as an electron source of a large flat panel display. Thus, at the time of applying a plurality of devices to required electron sources, the uniformity of shapes of conductive films of devices directly influences the uniformity of electron sources.

To manufacture a surface-conduction-type electron-emitting device, a method of forming the conductive film 4 without using the sputtering method or vacuum deposition method is disclosed in Japanese Patent Application Laid-Open No. 8-55560 or the like. As an example of the method, there is a method of obtaining a conductive film by applying a solution containing an organic-metal compound onto a substrate by a spinner and thereafter, patterning the solution into a desired shape and thermally decomposing the organic metal compound. Moreover, Japanese Patent Application Laid-Open Nos. 8-171850, 8-277294, 9-069334, 9-245623, 9-245625, 10-012136, and 10-326559 respectively disclose a manufacturing method of forming a conductive film of a desired shape by supplying droplets of a liquid (ink) containing a conductive-film-forming material onto a substrate by ink jet method and baking the substrate. Moreover, it is disclosed in some of the above described specifications to apply hydrophobic or hydrophilic treatment to the surface of a substrate before supplying a liquid (ink) containing the above described conductive-film-forming material to the substrate.

SUMMARY OF THE INVENTION

It is an object of the present invention to provide a high-conservation-stability ink used for an ink jet method for forming a conductive film used for an electron-emitting device or a conductive film used for various types of electronic devices, a method for manufacturing an electron-emitting device having a high electron-emitting characteristic, a method for manufacturing an electron source and a conductive film having a high uniformity and superior in characteristics, and a method for manufacturing an image-forming apparatus having a high uniformity and a high image quality.

Moreover, it is an object of the present invention to provide methods for manufacturing high-yield inexpensive electron-emitting device, electron source, and image-forming apparatus.

The configuration of the present invention made to achieve the above described objects will be described below.

That is, the first aspect of the present invention is an ink for an ink jet, characterized by using a solvent containing nitrogen as a main solvent and comprising a metallic element or a semiconductor element.

The second aspect of the present invention is a method for manufacturing a conductive film, comprising the steps of: preparing a substrate; supplying a liquid containing a metallic element or a semiconductor element onto the substrate; and forming a conductive film by heating the substrate to which the liquid is supplied, wherein the liquid uses a solvent containing nitrogen as a main solvent.

The third aspect of the present invention is a method for manufacturing an electron-emitting device, comprising the steps of: supplying a liquid containing a metallic element or a semiconductor element so as to connect a pair of electrodes arranged on a substrate each other; forming a conductive film by heating the substrate to which the liquid is supplied; and forming an electron-emitting portion by applying a voltage between the pair of electrodes, wherein the liquid uses a solvent containing nitrogen as a main solvent.

The fourth aspect of the present invention is a method for manufacturing an electron-emitting device, comprising the steps of: forming first and second electrodes on a substrate; bringing a solution containing polysiloxane or a solution containing an organic silicon compound and acid into contact with the substrate; supplying a liquid containing a conductive-film-forming material so as to connect the first and second electrodes each other; forming a conductive film by baking the solution supplied onto the substrate; and forming an electron-emitting portion by applying a voltage between the first and second electrodes.

The fifth aspect of the present invention is a method for manufacturing a conductive film, comprising the steps of: preparing a substrate; supplying a solution containing polysiloxane or a solution containing an organic silicon compound and acid onto the substrate; supplying a liquid containing a conductive-film-forming material onto the substrate; and forming a conductive film by baking the solution supplied onto the substrate.

The sixth aspect of the present invention is a method for manufacturing an electron-emitting device, comprising the steps of: forming first and second electrodes on a substrate; controlling a contact angle of the substrate surface to water to 70° or more; supplying a liquid containing a conductive-film-forming material so as to connect the first and second electrodes on the substrate each other; forming a conductive film by heating the substrate to which the liquid is supplied; and forming a conductive film portion by applying a voltage between the first and second electrodes.

The seventh aspect of the present invention is a method for manufacturing a conductive film, comprising the steps of: preparing a substrate; controlling a contact angle of the substrate surface from water to 70° or more; supplying a liquid containing a conductive-film-forming material onto the substrate; and forming a conductive film by heating the substrate to which the liquid is supplied.

DETAILED DESCRIPTION OF THE PREFERRED EMBODIMENTS

Figure 1A:
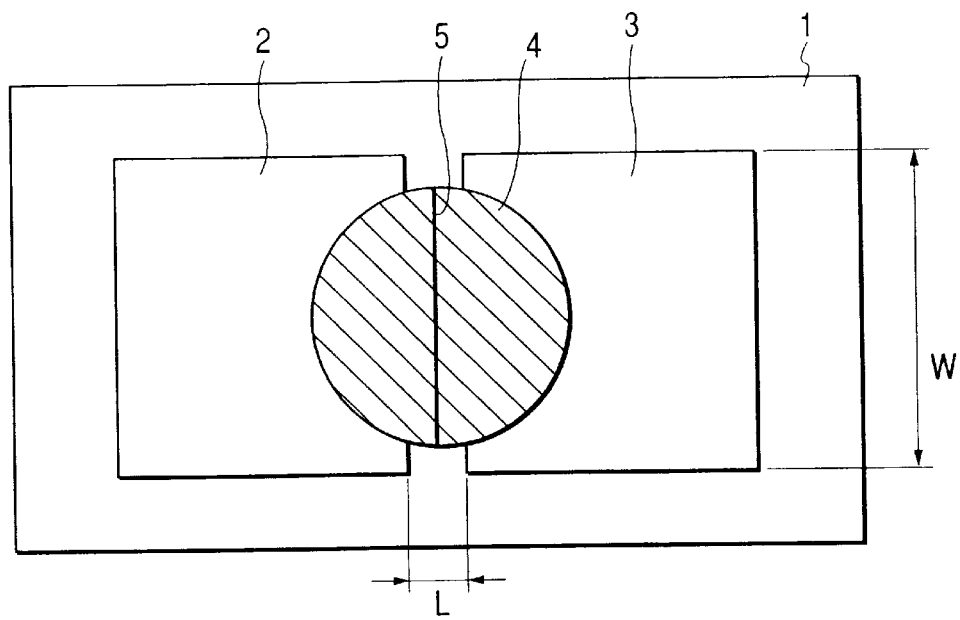
FIGS. 1A and 1B are schematic diagrams showing an electron-emitting device of the present invention.

Some types of inks (liquids containing a conductive-film-forming material) used for the above described ink-jet system have physical properties not matching the ink-jet system. Therefore, it is difficult to eject the inks or supply them to a substrate in some cases.

Moreover, at the time of using a water-soluble organic metal compound as the conductive-film-forming material, a main component of ink is water. Therefore, ions contained in the ink affect the water-soluble organic metal compound and thereby, the ink is not always kept in a preferable state.

Furthermore, in case of a method of supplying a liquid (ink) containing a material for forming a conductive film onto a substrate in accordance with an ink jet system, it is difficult to control a shape of a droplet (ink) supplied onto the substrate and a shape of a conductive film formed after baking of the ink unless surface energy of the substrate surface and surface tension of the ink have a preferable relation.

Therefore, it is considered to adjust the surface energy of the substrate surface before the above described solution is supplied onto the substrate. Particularly, at the time of using an electronic device requiring a very small conductive film such as the above described electron-emitting device, MIM device, TFT device or the like for a display unit having a diagonal of tens of inches, it is necessary to form a conductive film on a substrate having a large area at a high uniformity. However, at the time of applying a treatment agent for adjusting surface energy to a large-area substrate, the agent is not uniformly applied to the substrate and thereby, it is impossible to obtain a conductive film having a desired shape at a high uniformity in some cases.

For example, at the time of using fluoroalkylsilane as the above described treatment agent, it forms most bonds of silanol groups on a glass substrate surface because it has a high reactivity. Therefore, the surface energy of a plane contacting with a droplet (ink) decreases. As a result, the hydrophobic property of the substrate surface rises up to a degree at which droplets cannot be stably formed.

Moreover, to adjust the surface energy of the substrate surface by using hexamethyldisilazane, a cleaning degree of the substrate become important. That is, when a substrate is not sufficiently cleaned and thereby, a blot is present on the surface of the substrate, surface energy is not sufficiently adjusted by a coupling agent or the surface energy is fluctuated depending on a portion because a hydrophobic-treatment agent cannot react with the substrate on the blot.

At the time of using a conductive film formed by supplying droplets of a liquid (ink) containing a conductive-film-forming material onto the above described substrate insufficiently surface-treated by an ink jet system and baking the substrate for an electron-emitting device, this affects the step of forming an electron-emitting portion on the conductive film and thereby, the reproducibility of an electron-emitting characteristic is lowered in some cases. Moreover, in case of an electron source on which a plurality of the electron-emitting devices are arranged, a problem occurs that electron-emitting characteristics are fluctuated. Furthermore, in case of an image-forming apparatus such as a flat panel display or the like configured by arranging the electron source and an image-forming member such as a phosphor or the like so as to be faced each other, there is a problem in that fluctuation of electron-emitting characteristics between devices results in deterioration of image quality.

The present invention is made to solve the above described problems.

First, a basic configuration of an electron-emitting device which is an electronic device to which the present invention can be preferably applied will be described below by referring to FIGS. 1A and 1B.

Figure 1B:
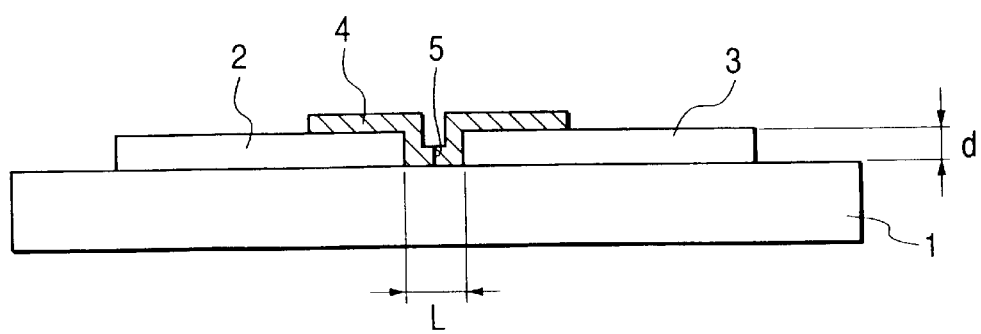

FIG. 1A is a schematic top view and FIG. 1B is a schematic sectional view of FIG. 1A. In FIGS. 1A and 1B, reference numeral 1 denotes a substrate, 2 and 3 denote electrodes, 4 denotes a conductive film, and 5 denotes an electron-emitting portion.

The substrate 1 can use one of quartz glass, glass obtained by reducing the content of an impurity such as Na or the like, soda lime glass, a layered product configured by layering $SiO_2$ on soda lime glass through sputtering or the like, ceramics, Si substrate, or the like. However, at the time of using an electron-emitting device for an image display unit, it is preferable to use glass for the substrate 1 by considering the sealing step to be described later because glass is generally used for a member on which image displaying members such as phosphors or the like are arranged to be described later.

The faced electrodes 2 and 3 can respectively use a general conductive material to be properly selected out of a printing conductor configured by metals such as Ni, Cr, Au, Mo, W, Pt, Ti, Al, Cu, and Pd or an alloy of some of the metals and metals such as Pd, Ag, Au, $RuO_2$, and Pd—Ag or metal oxide and glass; a transparent electric conductor such as $In_2O_3$—$SnO_2$, and a semiconductor such as polysilicon.

An electrode interval L, electrode length W, and shape of the conductive film 4 are designed by considering a configuration to be applied. It is as preferable to set the electrode interval L in a range of hundreds of nanometers to hundreds of microns and more preferable to set it in a range of several microns to tens of microns by considering a voltage to be applied between electrodes. It is preferable to set the electrode length W in a range of several microns to hundreds of microns by considering a resistance value and an electron-emitting characteristic of an electrode. It is possible to set a film thickness d of the electrodes 2 and 3 in a range of tens of nanometers to several microns.

Separately from the configuration shown in FIGS. 1A and 1B, it is also possible to use a configuration in which the conductive film 4 and electrodes 2 and 3 are formed in order on the substrate 1.

A material configuring the conductive film 4 is properly selected out of metals such as Pd, Pt, Ru, Ag, Au, Ti, In, Cu, Cr, Fe, Zn, Sn, Ta, W, and Pb; metal oxides such as PdO, $SnO_2$, $In_2O_3$, PbO, and $Sb_2O_3$; borides such as $HfB_2$, $ZrB_2$, $LaB_6$, $CeB_6$, $YB_4$, and $GdB_4$; carbides such as TiC, ZrC, HfC, TaC, SiC, and Wc; nitrides such as TiN, ZrN, and HfN; semiconductors such as Si and Ge; and carbon.

A thickness of the conductive film 4 is properly set by considering the step coverage on the electrodes 2 and 3, a resistance value between the electrodes 2 and 3, and "forming" conditions to be described later. However, it is generally preferable to set the film thickness in a range of several angstroms to hundreds of nanometers and more preferable to set it in a range of 1 to 50 nm. It is preferable that the resistance value has Rs of $10^2$ to $10^7$ Ω. Rs is a value appearing when assuming a resistance value R obtained by measuring the resistance of a thin film having a width w and a length l in the longitudinal direction of the film as R=Rs(l/w).

The electron-emitting portion 5 includes a gap and depends on a thickness, quality and material of the conductive film 4 and the "forming" step and "activating" step to be described later.

The front end of the gap and the conductive film 4 nearby the gap may have a film containing carbon (carbon film). The film containing carbon (carbon film) comprising graphite (containing so-called HOPG, PG, and GC in which HOPG has an almost-complete graphite crystal structure, PG has a crystal grain size of approx. 200 and a slightly-disordered crystal structure, and GC has a crystal grain size of approx. 20 and a further-disordered crystal structure) or amorphous carbon (including a mixture of amorphous carbon and microcrystal of the above described graphite). It is preferable to set the thickness of the film in a range of 500 Å or less and more preferable to set it in a range of 300 Å or less.

Then, a preferable electron-emitting-device manufacturing method of the present invention will be described below by referring to FIGS. 2A to 2E. Also in FIGS. 2A to 2E, a portion same as that in FIGS. 1A and 1B is provided with the same reference numeral as that in FIGS. 1A and 1B.

Step-1
Electrode-forming Step

Figure 2A:
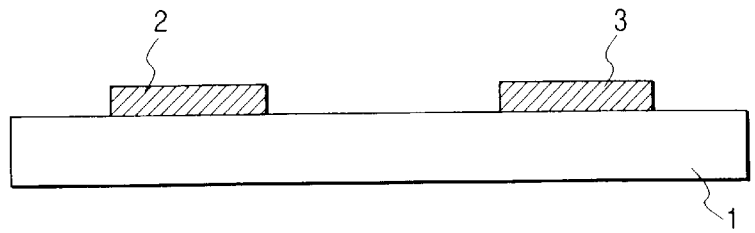
FIGS. 2A, 2B, 2C, 2D and 2E are schematic diagrams for explaining a method for manufacturing an electron-emitting device of the present invention.

A substrate 1 is completely cleaned by a detergent, pure water, and an organic solvent, the above described electrode material is deposited on the principal plane of the substrate 1 through the vacuum deposition method and sputtering method, and thereafter electrodes 2 and 3 are formed on the substrate 1 through, for example, the photolithography (FIG. 2A).

Step-2
Substrate Cleaning Step

It is preferable to clean the substrate 1 on which the electrodes are formed through hot-water cleaning or $O_3$ ashing. Surface energy of the substrate 1 is saturated in this step. Saturation of the surface energy is performed by leaving the substrate 1 as it is in a desiccator in which desiccants such as silica gels are arranged until the surface energy of the substrate 1 is saturated. The surface energy of the substrate 1 is almost saturated by leaving the substrate 1 as it is for 24 hr or more. In this step, a surface state of the substrate 1 is changed to a hydrophobic plane.

Step-3
Surface-energy Adjusting Step

The surface energy on the surface of the substrate 1 is adjusted.

Specifically, the surface energy of the substrate surface is adjusted to a desired value by bringing a liquid containing polysiloxane as a treatment agent or a liquid containing an organic silicon compound and acid as treatment agents into contact with the substrate surface.

In this case, "surface energy adjustment" more specifically denotes the step of adjusting the surface energy of the substrate surface so that a liquid containing a conductive-film-forming material to be described later is formed into a desired shape at a high uniformity.

To bring the above described liquid into contact with the substrate, there are a method of putting the substrate in a treatment vessel containing the liquid and a method of applying the liquid onto the substrate (spraying coating, dripping, or spin coating). It is preferable to use the method of soaking (dipping) the substrate in the liquid.

According to the above described method, it is possible to bring the liquid into contact with the substrate in a short time. Moreover, it is possible to control a reaction quantity and a reaction speed with the substrate surface only by controlling a concentration of the treatment agent (polysiloxane or organic silicon compound) contained in the liquid. As a result, it is possible to control the surface energy to a desired value easily.

Moreover, it is preferable that the above described liquid is an aqueous solution from the viewpoint of simplicity for handling.

The above described polysiloxane preferably used for the present invention includes dimethylpolysiloxane, methylphenylpolysiloxane, methylhdrogen polysiloxane, amino-denatured polysiloxane, epoxy-denatured polysiloxane, carboxyl-denatured polysiloxane, metacryl-denatured polysiloxane, phenol-denatured polysiloxane, polyether-denatured polysiloxane, alkyl-denatured polysiloxane, and methyl-styryl-denatured polysiloxane. Particularly, amino-denatured polysiloxane is preferably used.

It is permitted to use polysiloxane preferably used for the present invention directly or by mixing it with water or alcohol aqueous solution. To mix polysiloxane with water or alcohol aqueous solution, it is preferable to set the concentration of polysiloxane to 0.01 wt % or more though depending on the degree of purposed surface energy.

Moreover, particularly when using a soaking (dipping) method, the above described liquid excessively remains on the surface of a substrate in many cases. Therefore, after bringing the liquid into contact with the substrate, it is preferable to remove the extra liquid from the substrate surface by blowing a gas such as dry air on the substrate surface. It is preferable to use the so-called air knife as the means for blowing the above described gas.

It is preferable to leave the substrate provided with a treatment agent for surface-energy adjustment as it is at room temperature or more preferable to apply heat treatment to it. The heat treatment capable of improving the reactivity between the treatment agent and the substrate. It is preferable to perform the heat treatment at 110° C. or higher and more preferable to perform baking at 150° C.

When using a compound such as alkoxy silane, if a blot is present on the surface of a substrate, the substrate does not react with a treatment agent on the blot portion. Therefore, surface energy cannot be adjusted, or the surface energy is incompletely adjusted or fluctuated. However, when using polysiloxane among the above described treatment agents used for the present invention, polysiloxane is a high molecular compound so that a reaction with the surface of a substrate is unnecessary and a surface treatment effect is obtained by adsorbing the polysiloxane. Therefore, even if some blots are present on the substrate surface, a hydrophobic property appears and it is possible to adjust the surface energy of the substrate at a high uniformity.

That is, in case of surface treatment by polysiloxane used for the present invention, requests for configuration and cleaning degree of substrate surface are moderated.

Moreover, it is particularly preferable to use polysiloxane having an amino group for the present invention. Because an amino group improves the adsorbent property to a substrate (glass substrate), surface energy of the substrate is more preferably adjusted and the uniformity of supplied droplets is further improved.

As an acid to be mixed with the above described organic silicon compound, it is preferable to use any one of formic acid, acetic acid, propionic acid, butyric acid, lactic acid, citric acid, adipic acid, tartaric acid, succinic acid, malic acid, ascorbic acid, gluconic acid, oxalic acid, malonic acid, maleic acid, fumaric acid, and nitric acid.

As an organic silicon compound to be mixed with any one of the above described acids, a compound is particularly preferable which is water-soluble and superior in residual property (having less volatility). Specifically, it is preferable to use denatured polysiloxane into which a functional group is introduced and which has water solubility and particularly preferable to use amino-alkoxy-denatured polysiloxane in which an alkoxy group is introduced into amino-denatured polysiloxane and siloxane chain end.

Moreover, when a liquid containing an organic silicon compound and an acid is an aqueous solution, an organic silicon compound having an amino group is preferable as an organic silicon compound to be mixed with one of the above described acids. Polysiloxane having an amino group is particularly preferable. Each of the above described acids becomes salt by reacting with an amino group in the above described organic silicon compound and thereby, it is possible to improve the solubility of the organic silicon compound to water. Moreover, it is possible to control the polymerlization due to a reaction between molecules by changing organic-silicon-compound molecules to cations.

Furthermore, it is preferable that an alkoxy group is included in the above described organic silicon compound because it is possible to accelerate the chemical adsorbent action to a substrate. Furthermore, an organic silicon compound having an amino group in addition to an alkoxy group is preferable because it is possible to improve the chemical adsorbent action to a substrate.

When using a liquid having a low surface tension as a liquid (ink) containing a conductive-film-forming material to be described later, it is preferable to control a contact angle of a substrate surface (plane on which an electrode is formed) to water to 70° or more in the surface-energy adjusting step above described. The above described ink having a low surface tension includes an ink having a surface tension of $30 \times 10^{-5}$ N or less.

Step-4

Figure 2B:
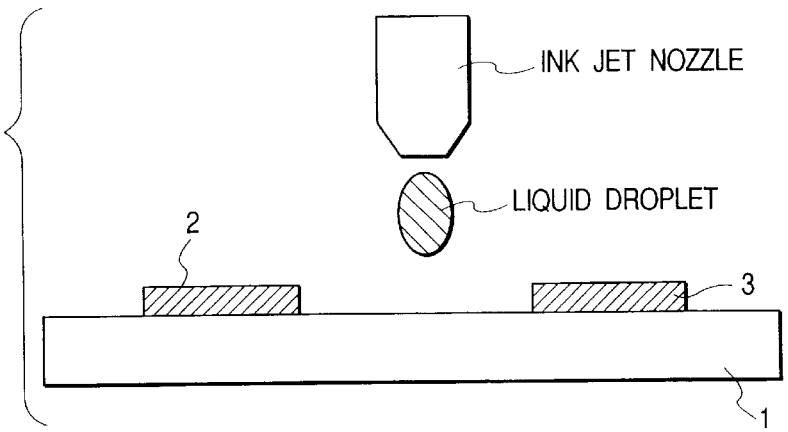

Step of Supplying a Liquid (Ink) Containing a Conductive-film-forming Material onto a Substrate A liquid containing a metal (element) or a semiconductive (element) and serving as a material for constituting the above described conductive film is supplied between the electrodes 2 and 3 on the substrate 1 in accordance with the ink jet method (FIG. 2B).

Specifically, it is preferable that the liquid (ink) containing the conductive-film-forming material is a solution containing the above described metal or semiconductive material and more preferable that the liquid is a solution in which the above described metal is contained as an organic metal compound.

The present invention can use either of the so-called piezo jet system for ejecting a liquid by using mechanical energy of a piezoelectric element or the like and the so-called bubble jet system for ejecting a solution in accordance with bubbles generated by thermal energy of a heater.

Figure 15:
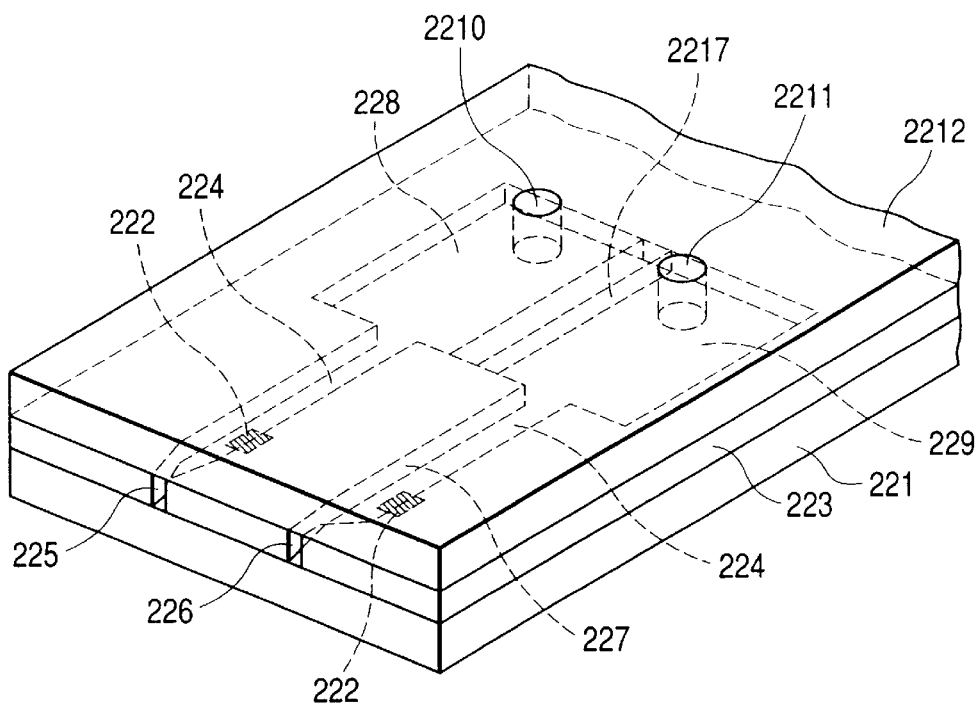
FIG. 15 is a schematic diagram of an ink jet system.
Figure 16:
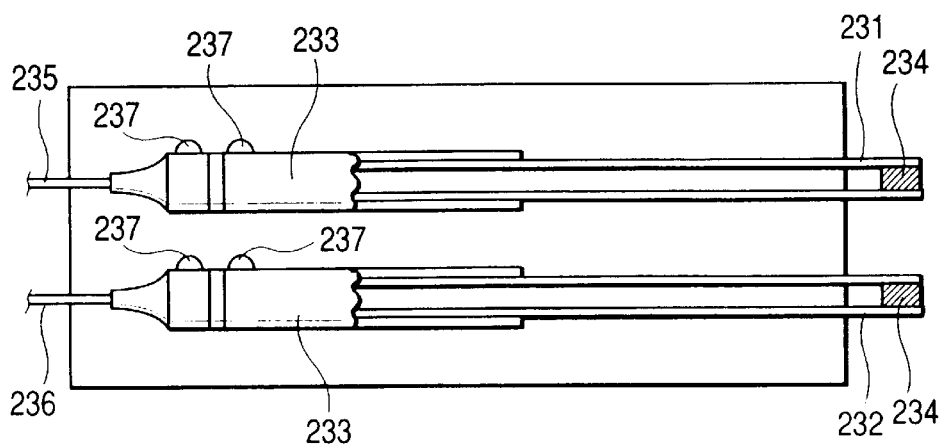
FIG. 16 is a schematic diagram of another ink jet system.

FIGS. 15 and 16 show an ink jet system used for the present invention. FIG. 15 shows a head unit of a bubble jet system. In FIG. 15, reference numeral 221 denotes a substrate, 222 denotes a heat generating portion, 223 denotes a support plate, 224 denotes a liquid channel, 225 denotes a first nozzle, 226 denotes a second nozzle, 227 denotes an ink-channel partition, 228 and 229 denote ink chambers, 2210 and 2211 denote ink feed port, and 2212 denotes a ceiling board.

Moreover, FIG. 16 shows a head unit of a piezo jet system. In FIG. 16, reference numeral 231 denotes a first glass nozzle, 232 denotes a second glass nozzle, 233 denotes a cylindrical piezo, 234 denotes a filter, 235 and 236 denote ink feed tubes, and 237 denotes an electric-signal input terminal. In FIGS. 15 and 16, two nozzles are used. However, the number of nozzles is not restricted to two.

When using the above described liquid containing the organic metal compound, it is possible to use water as a main solvent of the organic metal compound. However, it is particularly preferable to use a solvent containing nitrogen or an organic solvent containing nitrogen as a main solvent of the organic metal compound from the viewpoint of ink-storing stability.

The ink-storing stability is remarkable when using a water-soluble organic metal compound among organic metal compounds. When using water as a main solvent of an ink, ions in the ink affect a water-soluble organic metal compound and cause a problem that a metal is precipitated. However, a water-soluble organic metal compound contained in an ink using a solvent containing nitrogen (particularly, an organic solvent containing nitrogen) as a main solvent is not greatly affected by the above described ions. The present inventor et al. understand that the ink-storing stability is improved because a solvent containing nitrogen stably dissolves a metal compound.

Any one of the following materials can be preferably used for the present invention as a solvent containing nitrogen: morpholine, N-methylmorpholine, N-ethylmorpholine, pyridine, pyrrole, N-methyl-2-pyrolidone, and monoethanolamine.

Moreover, by setting a content of the solvent containing nitrogen for the above described ink to 50 wt % or more though slightly depending on an optimum range of an organic metal compound used, the solubility of the organic metal compound and the storing stability of the ink are sufficiently secured.

It is possible to use various materials as the organic metal compound. Particularly, when using a solvent containing nitrogen as a main solvent, it is preferable to use a metallic salt or metallic complex such as a halogen compound, nitric-acid compound, nitrous-acid compound, amine complex, or organic-amine complex. Moreover, it is particularly preferable to use a carboxylic-acid metallic salt as the organic metal compound. When using carboxylic-acid metallic salt, the solubility of the carboxylic-acid metallic salt and the storing stability of an ink are particularly sufficiently displayed by setting the content of the solvent containing nitrogen to 50 wt % or more of the whole ink.

Furthermore, it is preferable to use the carboxylic-acid metallic salt shown by the following general expression (1).

$$(C_nH_{(2n+1)}COO)_mM \qquad (1)$$

In the above described expression (1), M denotes a metal, n denotes an integer of 0 to 30, and m denotes an integer of 1 to 4.

By using the above described ink jet system, a shape of a droplet supplied onto a substrate is mainly determined by the relation between surface energy of a principal plane (plane on which an electrode is formed) of a substrate previously adjusted in the above described step and surface tension of a liquid (ink) containing a conductive-film-forming material supplied in the step. Therefore, it is particularly preferable to determined the surface tension of the ink by considering the relation with the surface energy of the principal plane of the substrate.

Moreover, when considering the ejection stability of an ink when the ink is ejected in accordance with the ink jet method, it is preferable that the nitrogen-contained solvent occupying the majority of the ink has a surface tension of 30 dyn/cm or more.

However, when the liquid (ink) containing the conductive-film-forming material has a high viscosity, it is possible to eject an ink even if the ink has a surface tension of 30 dyn/cm or less.

When using an ink having a surface tension of 30 dyn/cm or less for the present invention, it is preferable to set a contact angle of the surface of the substrate 1 to water to 70° or more.

Step-5
Step of Forming Conductive Film

Figure 2C:
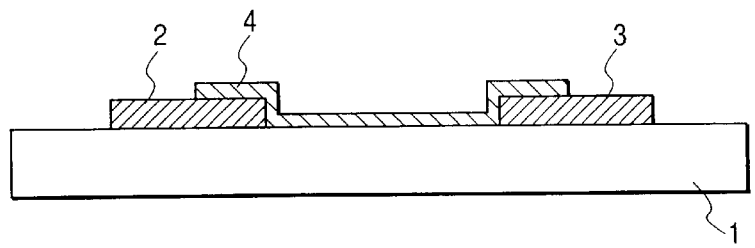

In the above described step, a liquid (ink) containing a conductive-film-forming material supplied onto the substrate 1 heats the substrate 1 in an atmosphere such as air in a baking furnace or on a hot plate. According to this step, the liquid supplied onto the substrate is thermally decomposed and thereby, the conductive film 4 is formed (FIG. 2C).

Step-6
"Forming" Step

Figure 2D:
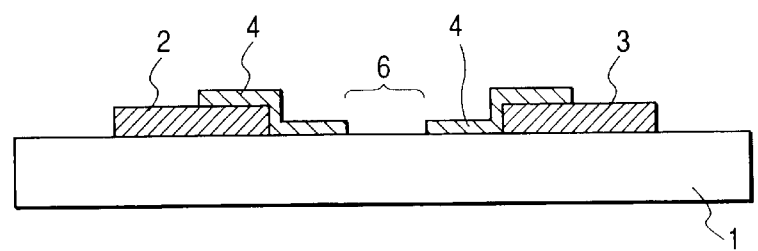

Then, the "forming" step is executed. The "forming" step is a step of supplying a current to the conductive film 4 by applying a voltage between electrodes 2 and 3. The second gap 6 is formed on a part of the conductive film 4 in this step (FIG. 2D).

Step-7
"Activating" Step

It is preferable to apply a processing referred to as the "activating" step to a formed device. The "activating" step is a step in which a device current If and an emission current Ie are extremely changed.

Figure 4:
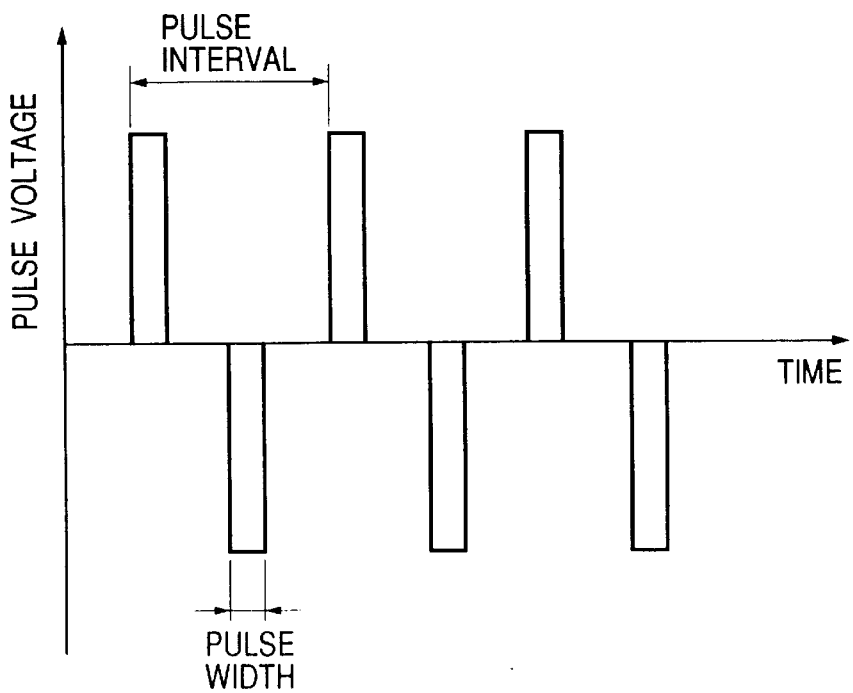
FIG. 4 is a pulse waveform used for an activating step of the Embodiment 1.

In the "activating" step, a bipolar pulse voltage shown in FIG. 4 is repeatedly applied between electrodes 2 and 3 under, for example, an atmosphere containing a carbon-compound gas. The atmosphere is obtained by introducing a proper carbon-compound gas into a completely-exhausted vacuum state.

Figure 2E:
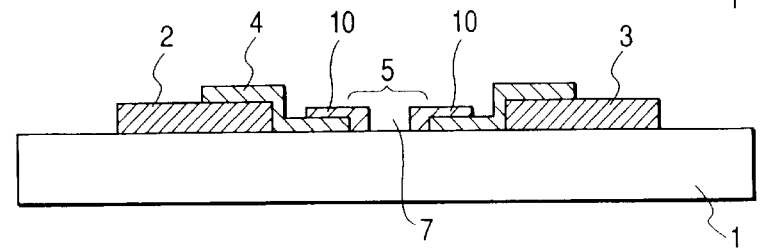

As a proper carbon compound, it is preferable to use any one of aliphatic hydrocarbon group such as alkane, alkene, or alkyne, aromatic hydrocarbon group, alcohol group, aldehyde group, ketone group, amine group, and organic acid group such as phenol, carvone, and sulfonic acid. Through this treatment, a film containing carbon (carbon film) 10 is formed on a substrate inside of the second gap 6 formed in the "forming" step and on the conductive film 4 nearby the gap 6 from carbon compounds present in the atmosphere (FIG. 2E).

In this "activating" step, a first gap 7 narrower than the second gap 6 formed in the "forming" step is formed. Thus, through the above described steps an electron-emitting portion 5 is formed.

Step-8
Stabilizing Step

It is preferable to apply the stabilizing step to an electron-emitting device obtained through the above described steps.

The stabilizing step is a step for exhausting carbon compounds remaining in a vacuum vessel. As an evacuation system for evacuating the vacuum vessel, it is preferable to use a system not using oil so that the oil leaked from the system does not affect characteristics of the device. Specifically, it is preferable to use an evacuation system such as an absorption pump or ion pump.

Moreover, when evacuating the vacuum vessel, it is preferable to heat the vacuum vessel so that carbon-compound molecules adsorbed to the inner wall of the vacuum vessel and the electron-emitting device are easily exhausted. It is preferable to use heating conditions of 150 to 300° C. and several hours or longer for the above described case. However, heating conditions are not restricted to the above described ones. It is preferable to use conditions properly selected out of various conditions including a size and shape of a vacuum vessel and a configuration of an electron-emitting device. It is necessary to minimize a pressure in the vacuum vessel and it is preferable to set the pressure to $1.3 \times 10^{-5}$ Pa or lower and particularly preferable to set the pressure to $1.3 \times 10^{-6}$ Pa or lower.

As an atmosphere when driving the electron-emitting device after completing the above described stabilizing step, it is preferable to keep the atmosphere when the above described stabilizing treatment is completed. However, an atmosphere is not restricted to the above described one, and if carbon compounds are sufficiently eliminated, it is possible to keep a stable-enough characteristic even if the degree of vacuum slightly lowers. By using the above described vacuum atmosphere, it is possible to control deposition of new carbon or carbon compounds and as a result, the device current lf and emission current le are stabilized.

The electron-emitting-device manufacturing method of the present invention described can be also applied to an electron source constituted by forming a plurality of electron-emitting devices on a substrate.

Figure 5:
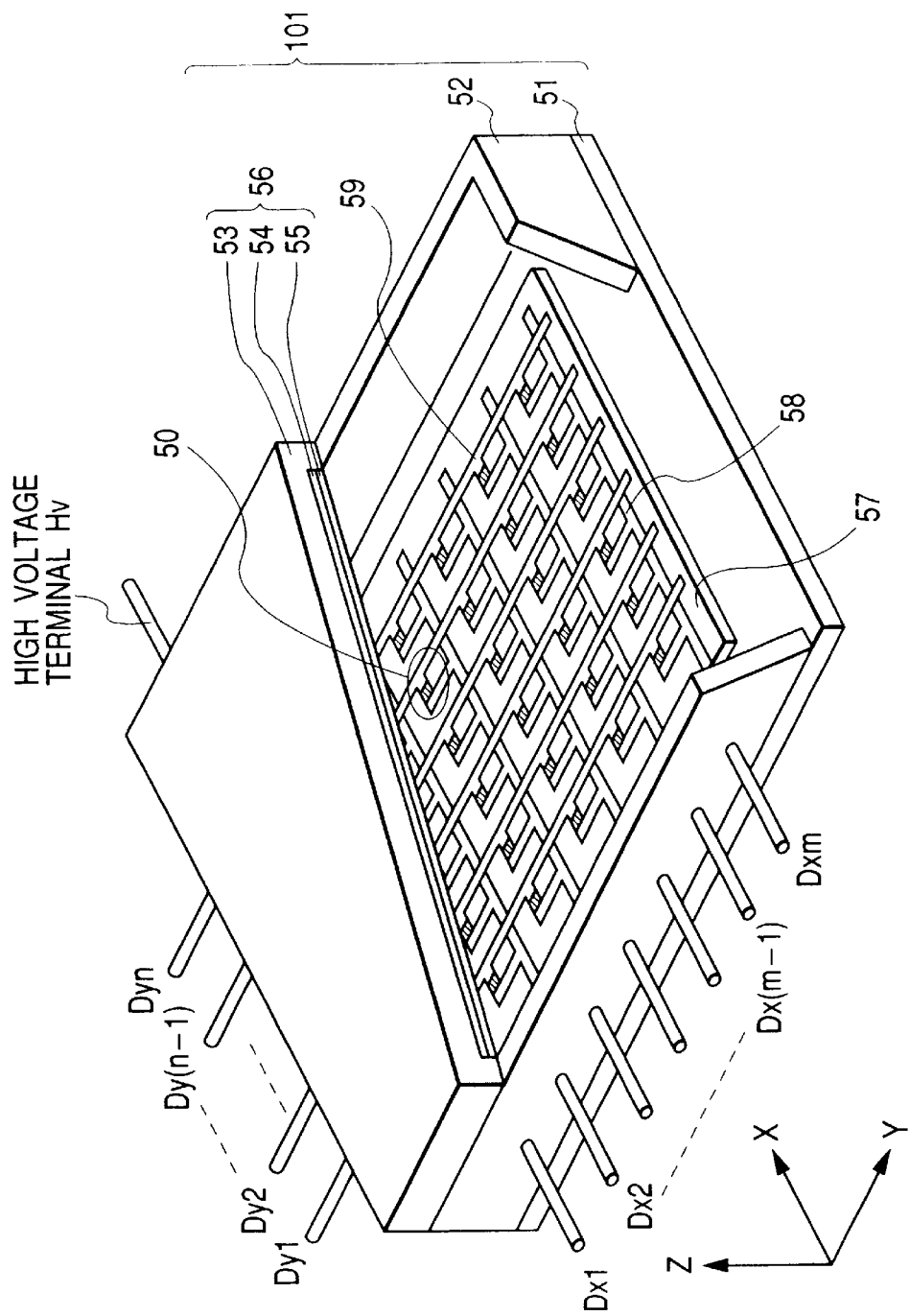
FIG. 5 is a schematic diagram showing a display panel of an image-forming apparatus of the present invention.

Then, a configuration and a manufacturing method of an image-forming apparatus using the present invention are described below by referring to FIG. 5. FIG. 5 shows an image-forming apparatus to which the present invention can be preferably applied.

In FIG. 5, reference numeral 57 denotes an electron-source substrate constituted by arranging a plurality of electron-emitting devices, 51 denotes a rear plate to which the electron-source substrate 57 is fixed, and 56 denotes a face plate constituted by forming a fluorescent film 54 and a metal back 55 on the inner face of a glass substrate 53. Reference numeral 52 denotes a support frame. The rear plate 51 and faceplate 56 are connected to the support frame 52 by frit glass. An envelope 101 is constituted by baking the face plate 56, rear plate 51, and support frame 52, for example, in air or nitrogen in a temperature range of 400 to 500° C. for 10 min or more and sealing them.

Reference numeral 50 denotes an electron-emitting device similar to that shown in FIGS. 1A, 1B and 2A to 2E. Symbols 58 and 59 denote a row-directional wiring and a column-directional wiring connected with a pair of electrodes of an electron-emitting device.

The rear plate 51 is mainly used to reinforce the strength of the substrate 57. Therefore, when the substrate 57 has a large-enough strength, it is possible to omit the separate rear plate 51. That is, it is also permitted to constitute the envelope 101 of the face plate 56, support frame 52, and substrate 57 by directly sealing the support frame 52 to the substrate 57. Moreover, it is possible to constitute the envelope 101 having a large-enough strength against the atmospheric pressure by setting a not-illustrated support referred to as spacer between the face plate 56 and the rear plate 51.

The fluorescent film 54 can be configured by only a phosphor in case of monochrome. A color fluorescent film can be configured by a block conductive material referred to as a black stripe or black matrix and a phosphor in accordance with the arrangement of the phosphor.

For the faceplate 56, it is permitted to form a transparent electrode (not illustrated) at the outside of the fluorescent film 54 in order to further improve the conductivity of the fluorescent film 54.

Then, an electron-source manufacturing method and an image-forming-apparatus manufacturing method of the present invention are described below by referring to FIGS. 13A to 13C.

Step-1

Step of Forming, Electrode, and Wiring

Figure 13A:
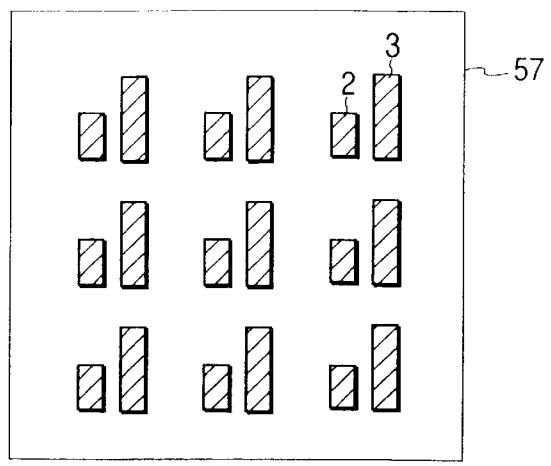
FIGS. 13A, 13B and 13C are schematic diagrams showing some of the steps of forming an electron source of the present invention.
Figure 13B:
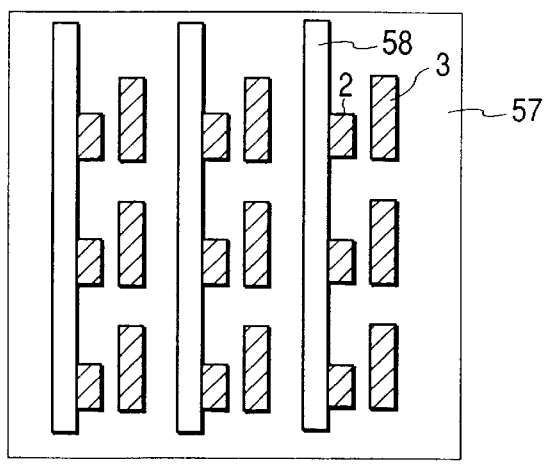

A substrate 57 is completely cleaned by a detergent, demineralized water, and an organic solvent to arrange and form pluralities of electrodes 2 and 3 on the substrate 57 (FIG. 13A). Moreover, a row-directional (x-directional) wiring 58, an insulating layer 81, and a column-directional (y-directional) wiring 59 are formed (FIGS. 13B, 13C, and 14D). It is possible to form the wirings, insulating layer, and electrodes in accordance with semiconductor fabrication methods including the screen printing method and publicly-known photolithography and sputtering methods. However, it is preferable to form the wirings 58 and 59 and the insulating layer in accordance with the screen printing method. Moreover, it is preferable to form the electrodes 2 and 3 in accordance with the offset printing method.

Step-2

Substrate Cleaning Step

It is preferable to execute the substrate-cleaning step similarly to step-2 described for the electron-emitting-device manufacturing method.

Step-3

Surface-energy Adjusting Step

Step-3 is executed similarly to step-3 described for the above electron-emitting-device manufacturing method.

Step-4

Step of Supplying Liquid (Ink) Containing Conductive-film Forming Material to Substrate Step-4 is executed similarly to step-4 described for the above electron-emitting-device manufacturing method.

Step-5

Figure 14D:
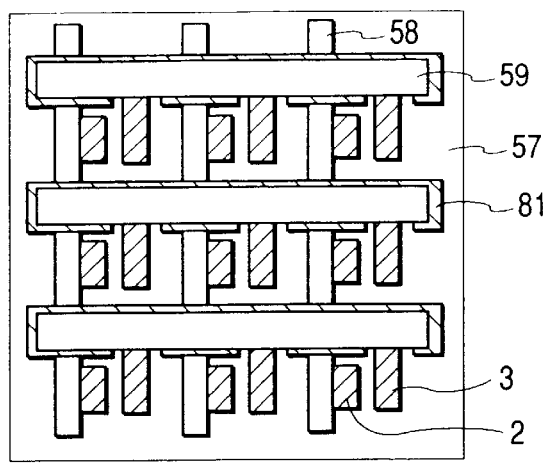
FIGS. 14D, 14E and 14F are schematic diagrams showing some of the steps of forming an electron source of the present invention.
Figure 14E:
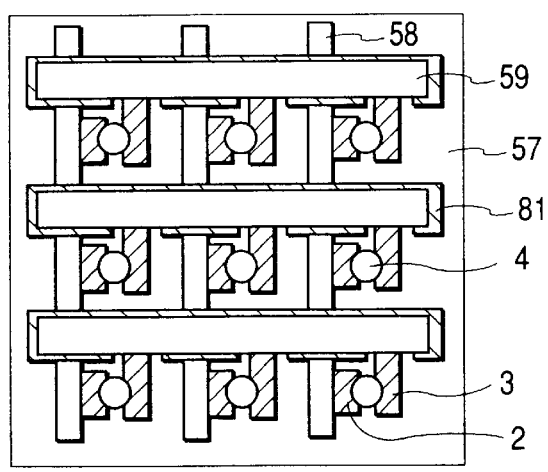

Step of Thermally Decomposing Liquid Containing Conductive-film-forming Material and Forming Conductive Film Step-5 is executed similarly to step-5 described for the above electron-emitting-device manufacturing method (FIG. 14E).

Step-6

"Forming" Step

A substrate completing step-5 is set to a vacuum chamber and then, the vacuum chamber is completely exhausted. Thereafter, treatment same as that in step-6 described for the above described electron-emitting-device manufacturing method is applied to the substrate to form a first gap on each conductive film 4.

Step-7

"Activating" Step

The above described organic gas is introduced into the vacuum chamber and the same treatment as that in step-7 described for the above described electron-emitting-device manufacturing method is applied to the substrate to arrange a carbon film and form the electron-emitting portion 5 on each conductive film 4. An electron source is formed through the above described steps.

Step-8
Sealing Step

The face plate and support frame and the rear plate (substrate 57) completing step-1 to step-7 are bonded each other through a frit to form the envelope 101.

Step-9
Stabilizing Step

The inside of the envelope is completely exhausted by a not-illustrated exhaust pipe, the stabilizing step same as step-8 of the above described electron-emitting-device manufacturing method is applied to the envelope and finally, a getter is flashed.

An electron-source manufacturing method and an image-forming-apparatus manufacturing method of the present invention are not restricted to the above described methods. It is also permitted to form an envelope and thereafter execute steps from step-6 downward.

Embodiments of methods for manufacturing an electron-emitting device, electron source, and image-forming-apparatus of the present invention are described below in detail by referring to the accompanying drawings.

Embodiment 1

In case of this embodiment, the image-forming apparatus shown in FIG. 5 is manufactured.

An electron source manufactured for this embodiment and a process for manufacturing an image-forming apparatus using the electron source are described by referring to FIGS. 13A to 13C and 2A to 2E.

(1) A rear plate 57 constituted by forming $SiO_2$ on the surface of slda lime glass up to a thickness of 0.5 μm in accordance with the sputtering method is prepared.

(2) A thousand pairs of electrodes 2 and 3 are formed in X direction and five thousand pairs of electrodes 2 and 3 are formed in Y direction on a plane on which an $SiO_2$ film is formed (FIG. 13A). To simply description, however, FIGS. 13A to 13C show the total of nine sets of electron-emitting devices, that is, three sets of electron-emitting devices in X direction and three sets of electron-emitting devices in Y direction.

In case of this embodiment, Pt is used as an electrode material and moreover, the interval between the electrodes 2 and 3 is set to 20 μm.

(3) Conductive paste is applied to the surface of the rear plate 57 on which the electrodes 2 and 3 are formed in accordance with the screen printing method. The conductive paste used for this embodiment uses a conductive material to which Ag particles and glass fillers are added. Thereafter, by baking the rear plate, 5000 row-directional wirings 58 are formed (FIG. 13B). In this step, a part of the electrode 2 is covered with the row-directional wirings 58 and the electrode 2 is connected with the row-directional wirings 58.

Figure 13C:
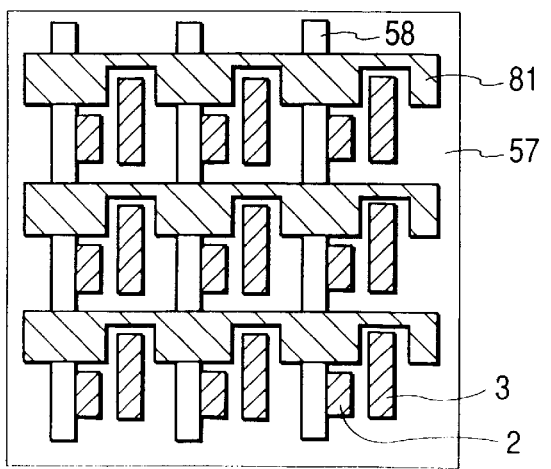

(4) One thousand insulating layers 81 are formed by applying paste containing glass binder and resin in the serrated pattern shown in FIG. 13C and baking the paste in accordance with the screen printing method.

(5) One thousand column-directional wiring 59 are formed by applying conductive paste containing Ag particles and a glass binder in the linear pattern shown in FIG. 14D in accordance with the screen printing method and baking the paste. In this step, a part of the electrode 3 is covered with the column-directional wirings 59 and the electrode 3 is connected with the column-directional wirings 59.

(6) Then, the rear plate 57 on which electrodes and wirings are formed is completely cleaned and dried. Thereafter, the rear plate 57 is put in a treatment vessel filled with a treatment agent KF99 (made by Shin-Etsu Chemical Co., Ltd.) made of methylhydrogen polysiloxane for 5 min. Thereafter, the rear plate 57 is taken out of the treatment vessel, dry air is blown on the surface of the rear plate to remove extra treatment agent from the surface. Then, as a result of measuring a contact angle of the rear plate (on the substrate and platinum electrode) to water at 60 points each, it is found that the fluctuation of contact angles at the measuring points on the substrate is 4%.

(7) Then, a liquid (ink) containing a conductive-film-forming material obtained by dissolving 0.5 g of palladium acetate in 100 g of N-methyl-2-pyrolidone is upplied to every gap between the electrodes 2 and 3. Then, a conductive film 4 made of PdO is formed by baking the in air at 350° C. (FIG. 14E).

This embodiment uses an ink jet system according to the piezo system that is one of the ink jet methods shown in FIG. 16 in order to supply the above described ink.

As a result of selecting 1000 films out of the conductive films 4 at random and observing diameters of the films by an optical microscope, it is found that the average diameter of the conductive films is approx. 100 μm and the fluctuation of them is 4%.

An electron-source substrate (rear plate) before "forming" is performed is formed through the above described steps.

(8) The electron-source substrate 57 before "forming" is performed manufactured through the above described steps is set in a vacuum chamber, the chamber is exhausted up to $10^{-4}$ Pa, and then hydrogen is introduced into the chamber to execute the "forming step" for applying a pulsating voltage to each row-directional wiring 58 and column-directional wiring 59. In this step, a current is supplied to each conductive film 4 to form a second gap in a part of each conductive film 4. In the "forming" step, a constant voltage pulse of 5 V is repeatedly applied. A pulse width and a pulse interval of a voltage waveform are respectively formed into a triangular wave of 1 msec and a triangular wave of 10 msec. It is assumed that "forming" is completed when a resistance value of a conductive film reaches 1 MΩ.

Figure 11A:
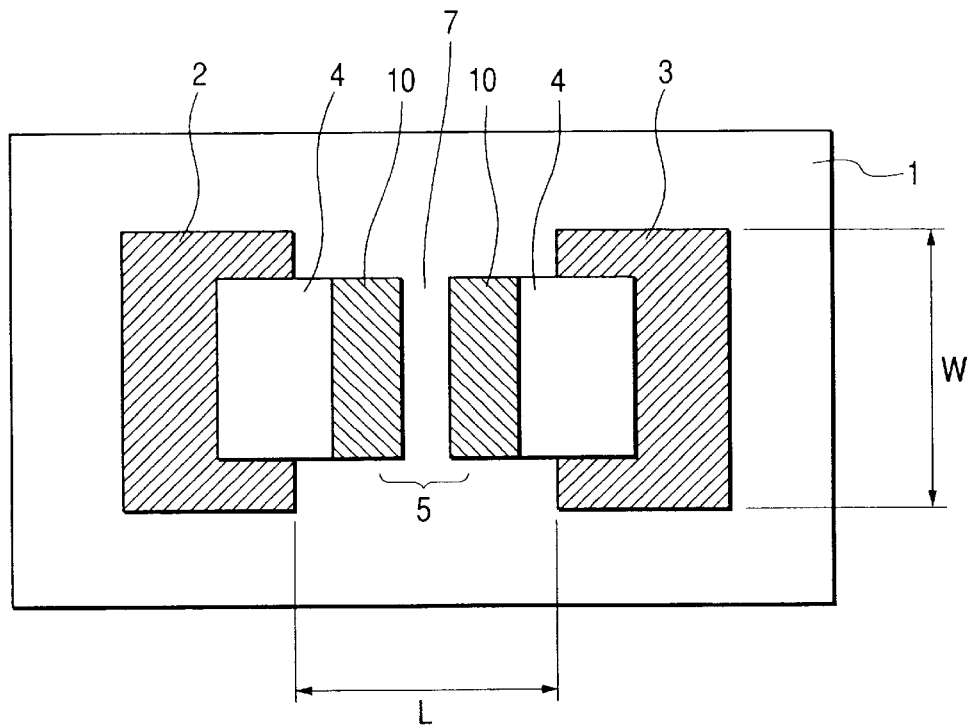
FIGS. 11A and 11B are schematic diagrams of a surface-conduction-type electron-emitting device.
Figure 11B:
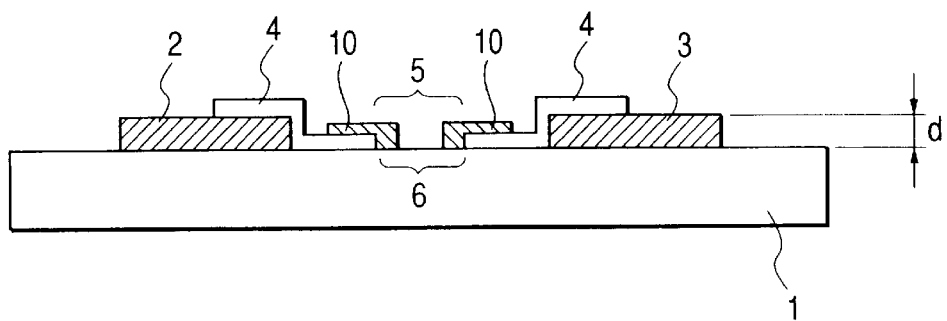
Figure 12A:
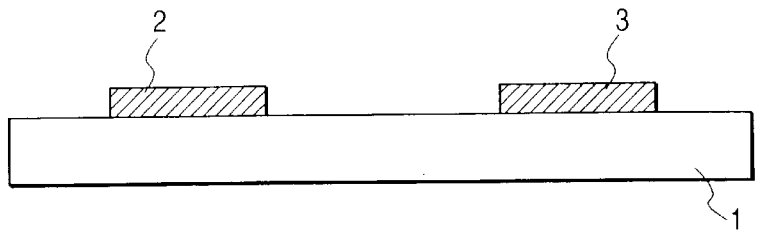
FIGS. 12A, 12B, 12C and 12D are schematic diagrams showing the steps of forming a surface-conduction-type electron-emitting device.
Figure 12B:
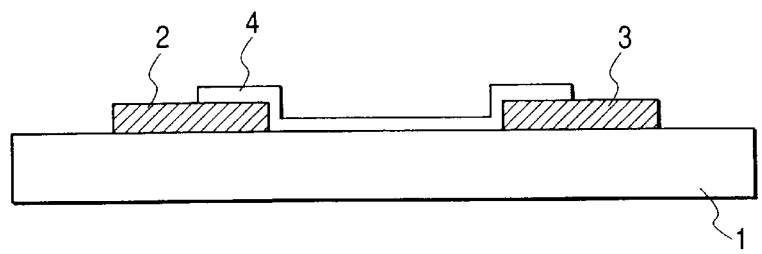
Figure 12C:
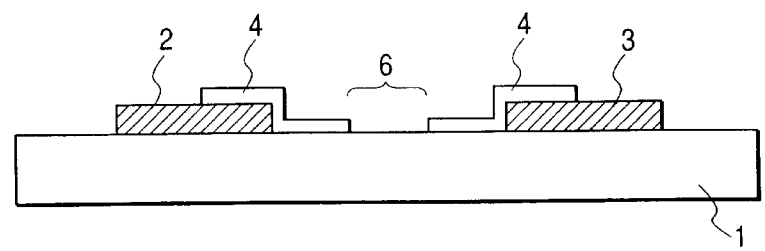
Figure 12D:
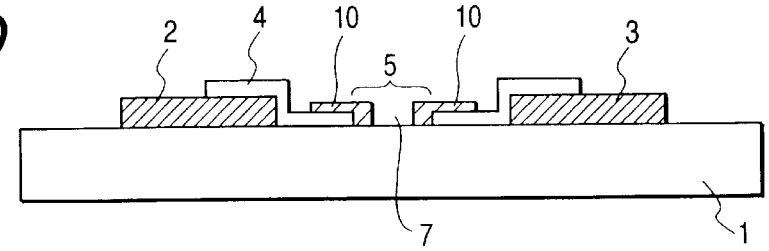
Figure 14F:
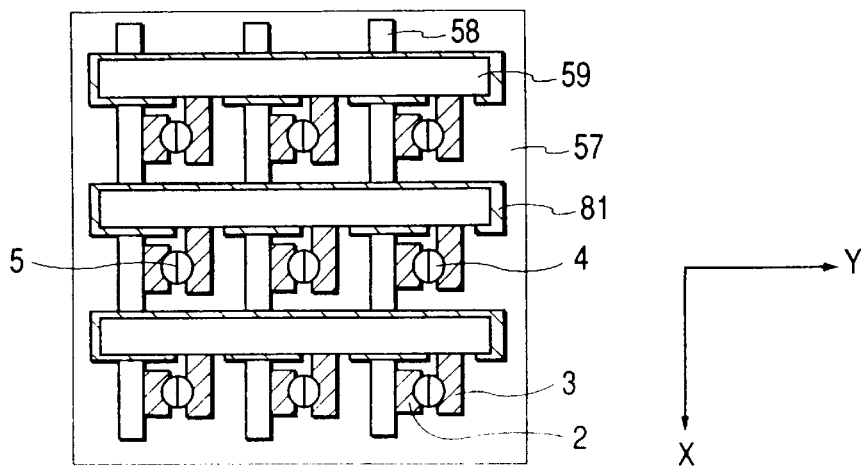

(9) A treatment referred to as "activating" step is applied to a device completing the "forming" step. The chamber is exhausted up to $10^{-6}$ Pa and then benzonitrile is introduced into the chamber up to $1.3 \times 10^{-4}$ Pa to execute the "activating step" for applying the pulsating voltage shown in FIG. 4 to each conductive film through each row-directional wiring 58 and column-directional wiring 59. In this step, a carbon film is formed inside of the second gap formed in the "forming" step and the conductive film 4 nearby the second gap to obtain the electron-emitting portion 5 (FIG. 14F). The sectional form of a device completing the "activating" step is basically the same as that shown in FIG. 11B.

An electron source is manufactured through the above described steps.

Then, a face-plate manufacturing method will be described below.

(10) First, a face-plate substrate 53 made of a material same as that of the rear plate 57 is completely cleaned and dried. Thereafter, a black member of a stripe pattern is formed on the substrate 57 in accordance with the photolithography method.

(11) Each color phosphor is formed between striped black members in accordance with the screen printing method.

(12) Moreover, a filming layer is formed on the black members and phosphors. A material obtained by dissolving a polymethacrylate-based resin in an organic solvent is applied and dried in accordance with the screen printing method as the filming-layer material.

(13) Then, Al is formed on the filming layer in accordance with the vacuum deposition method.

(14) Thereafter, the face plate is heated to remove the resin contained in phosphor paste and the filming layer and obtain a face plate on which phosphors, black members, and metal back are formed.

(15) A spacer (not illustrated) having a high-resistance film on its surface and an outer frame 52 previously provided with a joining member are arranged between the rear plate and face plate formed in the above described steps. Then, while the face plate and rear plate are completely aligned, members are joined each other by heating and pressuring the face plate and rear plate under a vacuum state and thereby, softening the joining member. In this sealing step, the envelope (display panel) 101 shown in FIG. 5 whose inside is kept at a high vacuum state is obtained. The high-resistance film formed on the surface of the spacer is used to flow electric charges accumulated on the spacer surface because electrons are irradiated to the spacer surface to the column-directional wiring 59 or metal back.

Figure 9:
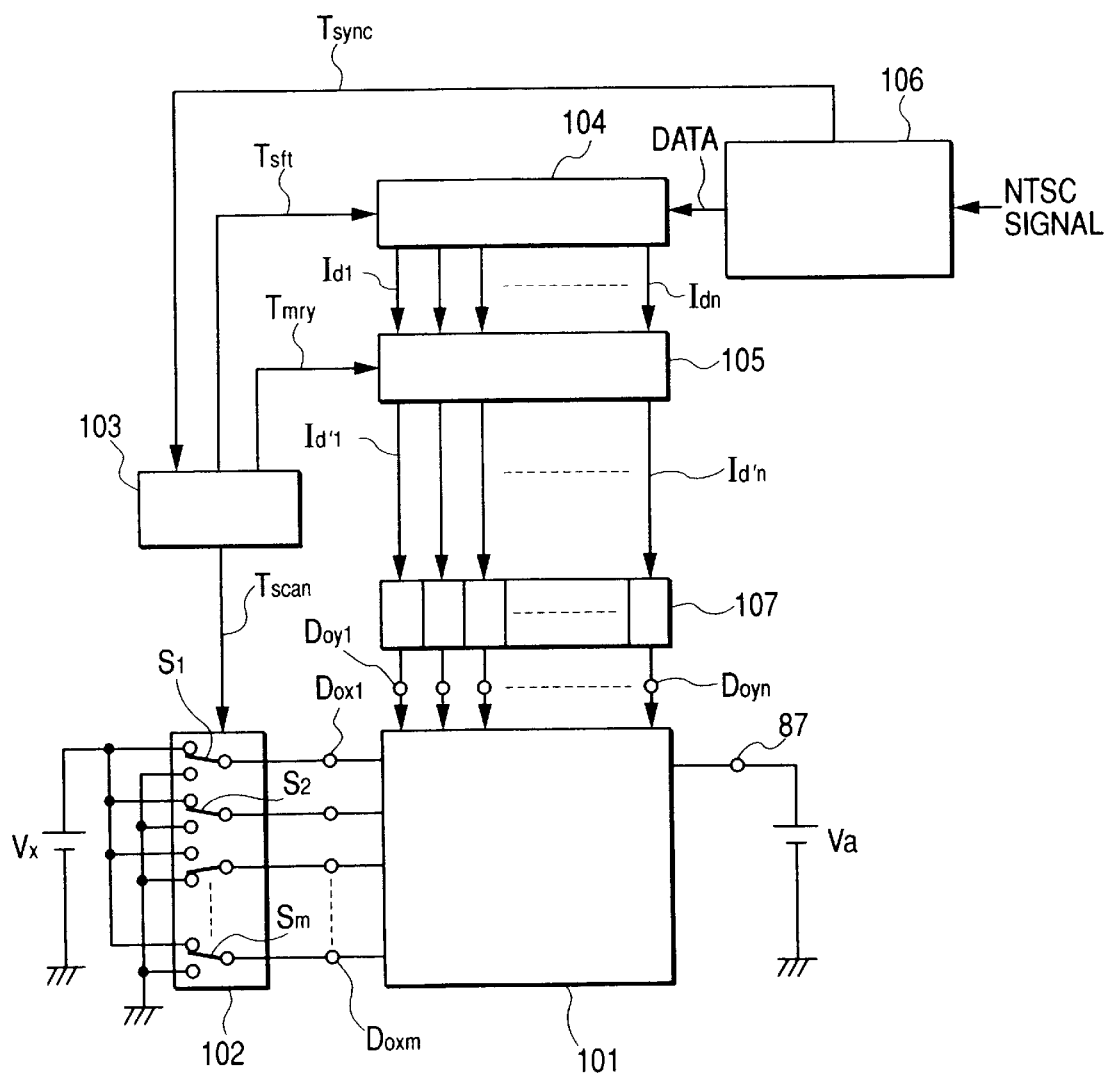
FIG. 9 is a block diagram of a driving circuit for performing television display for the Embodiment 3.
Figure 10:
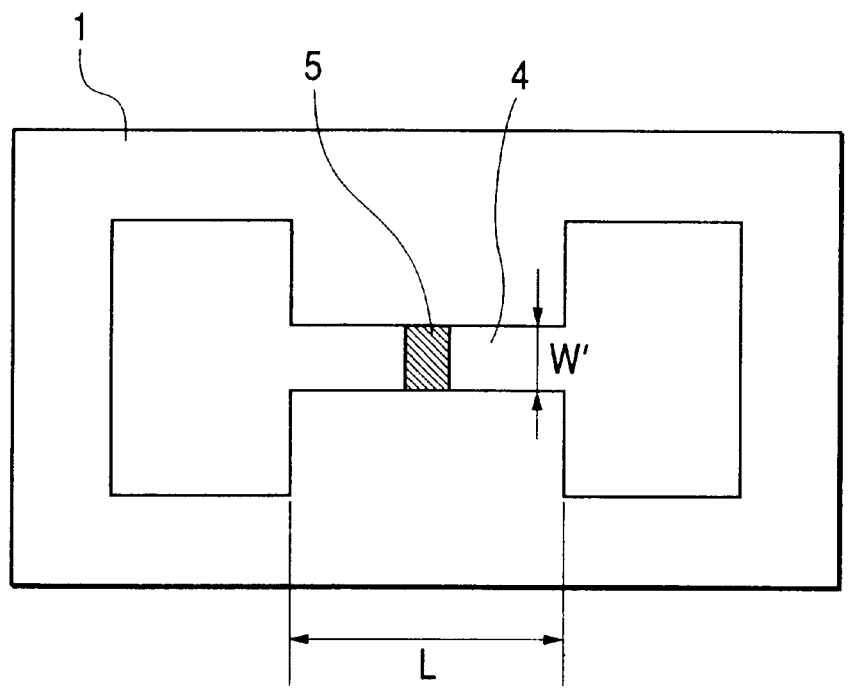
FIG. 10 is a schematic diagram of a conventional surface-conduction-type electron-emitting device.

The display panel 101 thus obtained is connected to the driving circuit shown in FIG. 9 to display a dynamic image through successive line scanning.

In case of this embodiment, a scanning signal is applied to the column-directional wiring 59 and a modulation signal is applied to the row-directional wiring 58.

As a result of displaying the dynamic image as described above, an image having a very high definition, a very high uniformity, and a high brightness is obtained over a long time. Moreover, no pixel defect is found. It is one of the reasons that the conductive film 4 supplied through ink jet method can be formed at a high uniformity because surface-energy treatment of the rear plate surface can be performed at a high uniformity over the entire surface of the rear plate. That is, because each emitted-electron quantity closely relates to a diameter of the conductive film 4, the fluctuation of the emitted-electron quantity directly connects with the brightness fluctuation of an image-forming apparatus.

Embodiment 2

Figure 7:
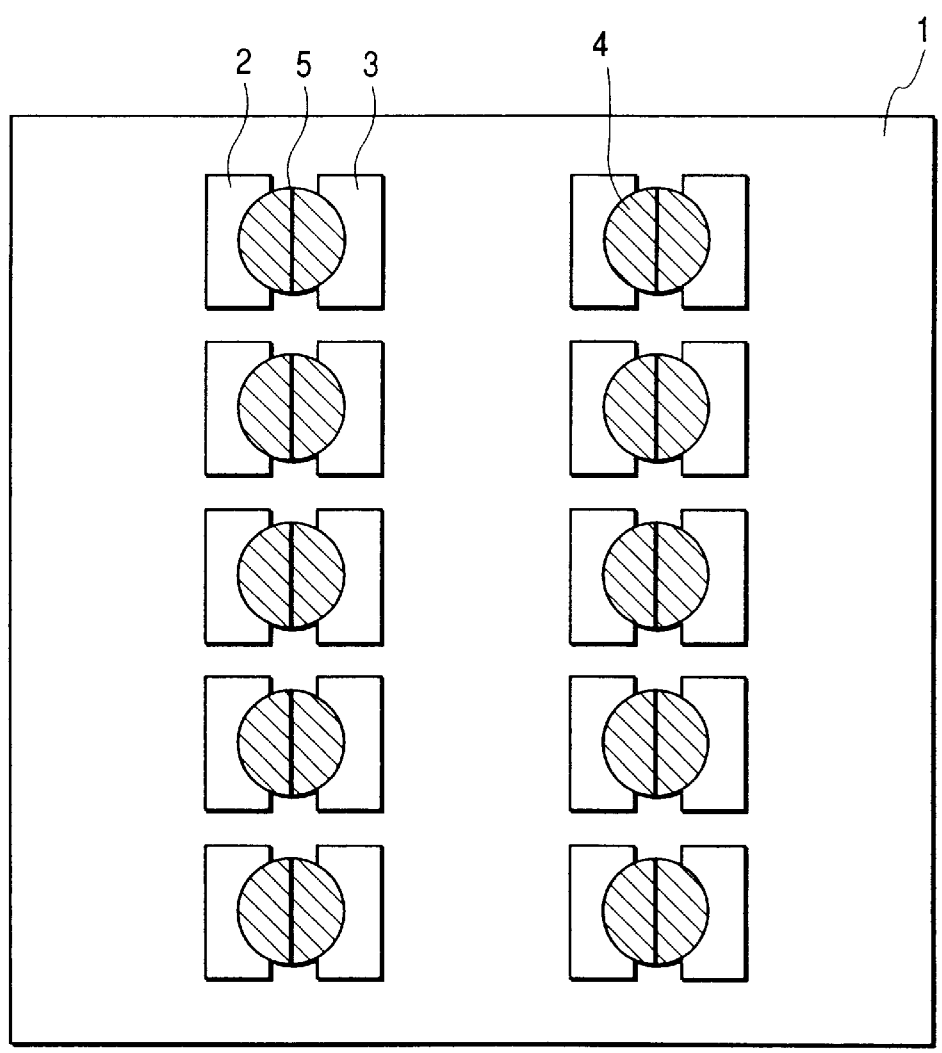
FIG. 7 is a top view of a test substrate of an electron-emitting device used for the Embodiment 1.

A basic configuration of a surface-conduction-type electron-emitting device of this embodiment is the same as that of the electron-emitting device in FIGS. 1A and 1B. In case of this embodiment, as shown in FIG. 7, ten electron-emitting devices same as those in FIGS. 1A and 1B are arranged on a substrate. In FIG. 7, a reference numeral same as that in FIGS. 1A and 1B denotes the same component.

Electron-emitting-device manufacturing steps of this embodiment are described below in order by referring to FIGS. 1A and 1B, 2A to 2E, and 7.

Step-a

Patterns of electrodes 2 and 3 are formed on cleaned soda lime glass 1 with photoresist (RD-2000N-41 made by Hitachi Chemical Co., Ltd.) to deposit Pt having a thickness of 500 Å on the patterns in accordance with the vacuum deposition method. The photoresist patterns are dissolved by an organic solvent to lift off the deposited film and form the electrodes 2 and 3 having an electrode interval L of 30 $\mu$m (FIG. 2A). Moreover, the electrodes 2 and 3 are cleaned with demineralized water.

Step-b

The $O_3$-ashing is applied to the substrate 1 on which the electrodes 2 and 3 are formed at 150° C. for 30 min and thereafter, the electrodes 2 and 3 are left in a desiccator using silica gel as a desiccant for two days.

Step-c

The substrate 1 is heated in an atmosphere of saturated vapor of dimethyl diethoxysilane at 90° C. for 60 min and then heated in air at 110° C. for 10 min to make the substrate surface hydrophobic. As a result of measuring a contact angle of the substrate surface to water, a value of 87° is obtained.

Step-d

Palladium acetate is dissolved in NMP (N-methylpyrolidone) serving as a main solvent so that the concentration by weight of palladium becomes approx. 0.15% to obtain a brown liquid (ink). As a result of measuring the surface tension of the liquid (ink), a value of 28 dyne/cm is obtained. Moreover, the above described ink is made to contain not only NMP but also tristearic ester of sorbitan and triethanolamine. In case of the ink used for this embodiment, deterioration or deposit is not observed for a long time.

A droplet of the above described liquid is supplied to the electrodes 2 and 3 formed in step-a by a piezo-jet-type ink jet system (piezo jet printer Model FP510 made by Canon Inc. is used) four times each so as to connect the electrodes each other (FIG. 2B).

Step-e

The sample manufactured in step-d is baked in air at 410° C. Thus, a conductive film 4 made of PdO is formed (FIG. 2C).

The electrodes 2 and 3 and the conductive film 4 are formed on the substrate 1 thorough the above described steps.

Figure 6:
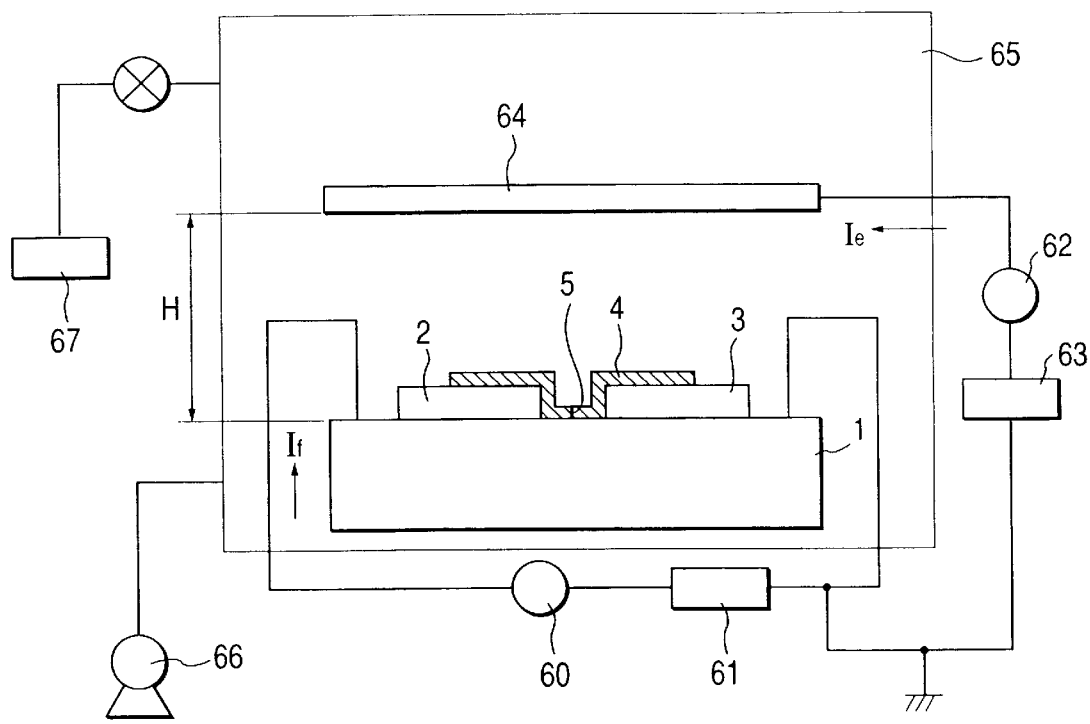
FIG. 6 is a schematic block diagram of a vacuum treatment system used for the Embodiment 1.

Then, the substrate of this embodiment completing the above described step-e is set into a vacuum vessel 65 of the vacuum treatment system in FIG. 6 to exhaust up to a vacuum degree of $1.3 \times 10^{-6}$ Pa by a vacuum pump 66.

The vacuum treatment system in FIG. 6 will be described below. FIG. 6 is a schematic diagram showing a vacuum treatment system. The vacuum treatment system not only performs the above described "forming" step, activating step, and stabilizing step but also has a function of a measuring and evaluating apparatus. Also in FIG. 6, a portion same as that in FIG. 1 is provided with the same reference numeral as that in FIGS. 1A and 1B.

In FIG. 6, reference numeral 65 denotes a vacuum vessel and 66 denotes an exhaust pump. Electron-emitting devices are arranged in the vacuum vessel 65. Reference numeral 61 denotes a power supply for applying a device voltage Vf to electron-emitting devices, 60 denotes an ammeter for measuring a device current If flowing between the electrodes 2 and 3, 64 denotes an anode electrode for acquiring an emission current Ie emitted from an electron-emitting portion 5 of a device, 63 denotes a high-voltage power supply for applying a voltage to the anode electrode 64, and 62 denotes an ammeter for measuring an emission current Ie emitted from the electron-emitting portion 5. For example, measurement can be performed by setting the voltage of the anode electrode 64 in a range of 1 kV to 10 kV and the distance H between the anode electrode 64 and an electron-emitting device in a range of 2 to 8 mm. Moreover, reference numeral 67 denotes an organic-gas producing source used to execute the "activating" step.

A unit necessary for measurement under a vacuum atmosphere such as a not-illustrated vacuum gauge is set in the vacuum vessel 65 so that measurement and evaluation under a desired vacuum atmosphere can be made. The exhaust pump 66 is configured by a very-high vacuum system comprising a turbopump, dry pump, and ion pump. The whole of the vacuum treatment system in which the electron-source substrate shown in FIG. 6 is arranged can be heated up to 350° C. by a not-illustrated heater.

Step-f

Then, the "forming" step is executed in the vacuum treatment system in FIG. 6. By supplying a current to each conductive film 4, a second gap 6 is formed on the portion of each conductive film 4 (FIG. 2D). A "forming" voltage waveform used for this embodiment is a pulse waveform and a voltage pulse for increasing a pulse peak value from 0 V in 1-V step is applied. A voltage waveform is formed into a rectangular waveform in which a pulse width of the voltage waveform is set to 1 msec and a pulse interval of the voltage waveform is set to 10 msec. It is determined that "forming" is completed when a conductive film has a resistance value of 1 MΩ or more.

Figure 3:
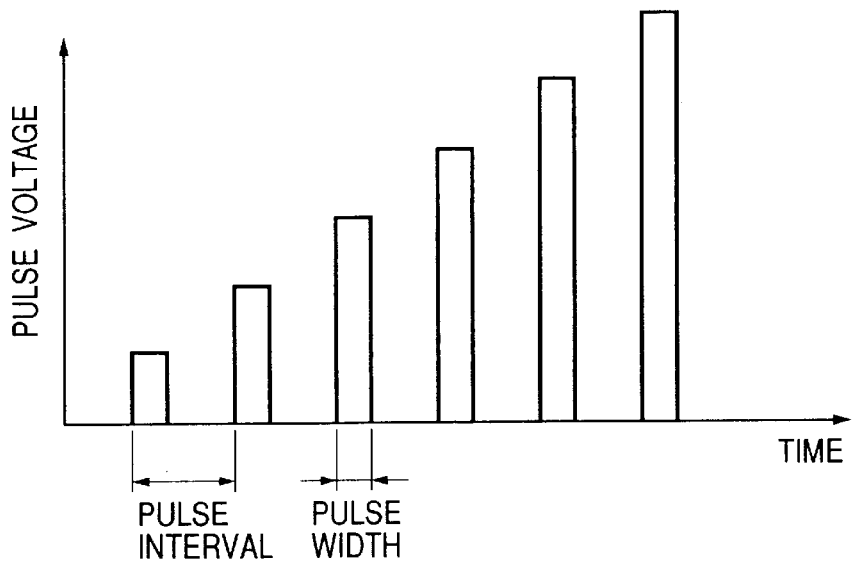
FIG. 3 is an electrifying and forming waveform used for an Embodiment 1.

FIG. 3 shows pulse waveforms used for this embodiment. A voltage is applied between the electrodes 2 and 3 by setting one of the electrodes 2 and 3 to a low potential and the other to a high potential.

Step-g

The "activating" step is applied to a device completing the forming step. A carbon film 10 is formed inside of the second gap 6 formed in the "forming" step in accordance with the "activating" step and simultaneously a first gap 7 is formed (FIG. 2E). In this step, the device current if and the emission current Ie are extremely changed.

In the "activating" step, acetone gas is introduced into the vacuum vessel 65 up to $1.3 \times 10^{-1}$ Pa to repeatedly apply a rectangular-wave pulse having a pulse peak value of 15 V, pulse width of 1 msec, and pulse interval of 10 msec for 20 min.

FIG. 4 shows pulse waveforms used for the "activating" step. In case of this embodiment, a low potential and a high potential are applied to the electrodes 2 and 3 so that the potentials are alternately replaced with each other every pulse.

Step-h

Then, the stabilizing step is started. The stabilizing step is a step for exhausting an organic gas contained in an atmosphere in the vacuum vessel 65, controlling the deposition of carbon or carbon compound on a device, and stabilizing the device current If and the emission current Ie. The whole of the vacuum vessel is heated up to 250° C. to exhaust organic-substance molecules adsorbed to the inner wall of the vacuum vessel 65 and electron-emitting devices. In this case, a vacuum degree is set to $1.3 \times 10^{-6}$ Pa. In case of this embodiment, ten electron-source substrates shown in FIG. 7 are manufactured through the above described steps.

Thereafter, characteristics of an electron-emitting device are measured at the above described vacuum degree. As a result, it is found that average values of electron-emitting characteristics of the ten devices are 2 mA±0.05 mA in case of the device current If and 3 μA±0.06 μA in case of the emission current Ie.

Embodiment 3

A metal-contained solution using DMF (dimethylformamide) is prepared instead of NMP used in step-d of the Embodiment 2 and other steps are executed similarly to the case of the Embodiment 2 to manufacture the electron-source substrate 1 having ten devices as shown in FIG. 7.

Thereafter, characteristics of each electron-emitting device are measured similarly to the case of the Embodiment 2. As a result, average values of electron-emitting characteristics of the electron-source substrate are 2 mA±0.05 mA in case of the device current If and 3 μA±0.06 μA in case of the emission current Ie.

Embodiment 4

This Embodiment shows a case of manufacturing an image-forming apparatus.

Figure 8A:
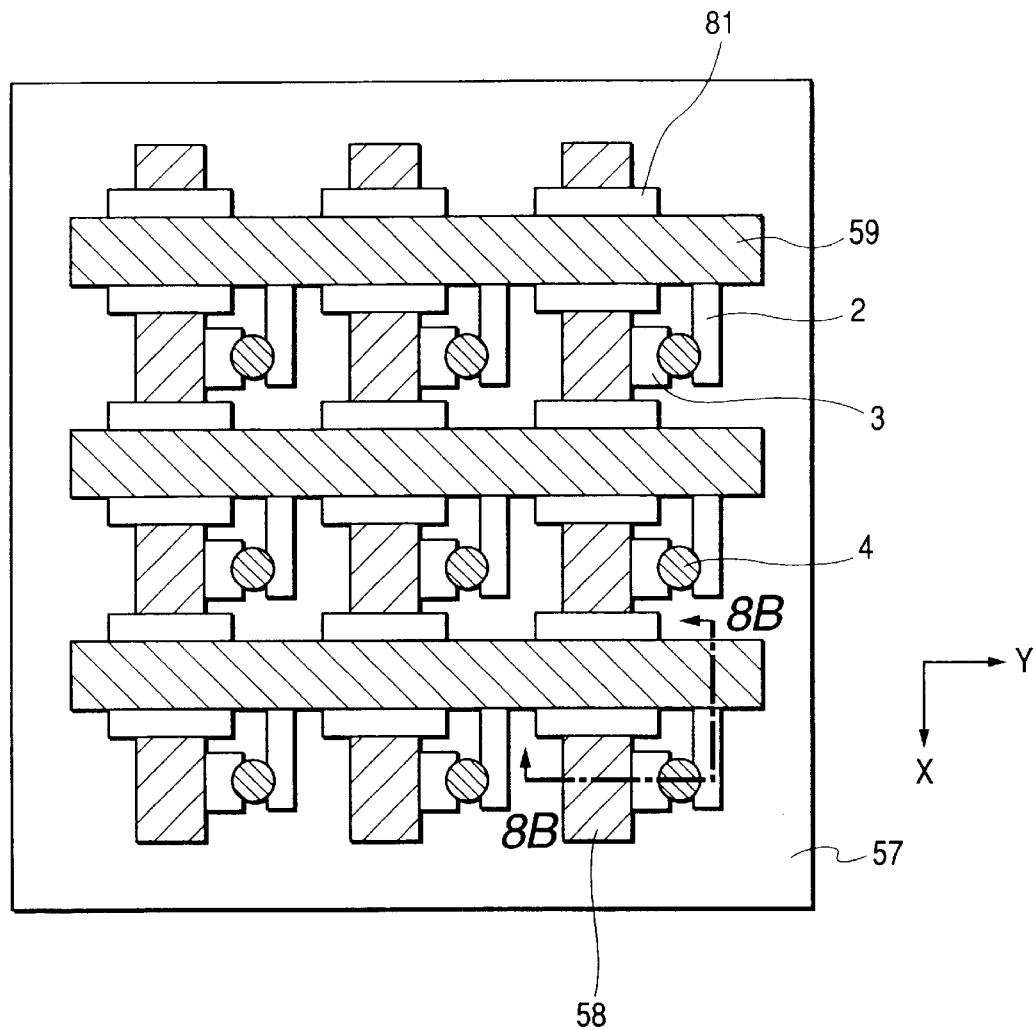
FIGS. 8A and 8B are schematic diagrams showing a part of an electron source used for an Embodiment 3.
Figure 8B:
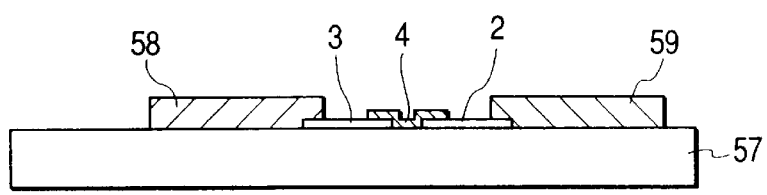

FIG. 8A shows a top view of a part of an electron source and FIG. 8B shows an 8B—8B sectional view in FIG. 8A. In FIGS. 8A and 8B, reference numeral 57 denotes a substrate, 58 denotes a column-directional wiring corresponding to Dxm, 59 denotes a row-directional wiring corresponding to Dyn, and 81 denotes a layer-insulating layer.

The image-forming apparatus of this embodiment is the same as that in FIG. 5. In case of this embodiment, however, the same substrate is used for a rear plate and the substrate 57. A manufacturing method is specifically described below in order of steps.

Step-1

Electrodes 2 and 3 are formed on cleaned soda lime glass 57 in accordance with the offset printing method. An electrode interval L is set to 20 μm and an electrode width W is set to 125 μm.

Step-2

The column-directional wiring 58 is formed in accordance with the screen printing method. Then, the layer-insulating layer 81 having a thickness of 1.0 μm is formed in accordance with the screen printing method. Moreover, the column-directional wiring 59 is formed in accordance with the screen printing method.

Step-3

The substrate 57 on which the electrodes 2 and 3, row-directional wiring 59, and column-directional wiring 58 are formed is cleaned by hot water of 80° C. and thereafter, left as it is in a desiccator using silica gel as a desiccant for two days.

Step-4

The substrate 57 is heated in a saturated-vapor atmosphere of dimethyl diethoxysilane at 90° C. for 60 min and then, heated in air at 110° C. for 10 min to make the substrate surface to hydrophobic. As a result of measuring a contact angle of the substrate surface to water, a value of 87° is obtained.

Step-5

Palladium acetate is dissolved in NMP (N-methylpyrolidone) so that the concentration by weight of palladium becomes approx. 0.15% to obtain a brown liquid (ink). As a result of measuring the surface tension of the liquid, a value of 28 dyne/cm is obtained. The above described ink is made to contain not only NMP but also cetyl alcohol and polyethylene. In case of the ink used for this embodiment, deterioration or deposit is not observed for a long time.

A droplet of the above liquid (ink) is supplied to the electrodes 2 and 3 formed in step-1 by a bubble-jet-type ink jet system (piezo jet printer Model FP510 made by Canon Inc. is used) four times each so as to connect the electrodes each other.

Step-6

Then, a face plate 56 (FIG. 5) is formed. The face plate is constituted so that a fluorescent film 54 in which phosphors are arranged and a metal back 55 are formed inside of a glass substrate. For the arrangement of the phosphors, a black stripe is provided between three-primary-color phosphors. The black stripe uses a material mainly containing generally-used graphite. They are formed in accordance with the screen printing method.

Step-7

The face plate 56 is sealed in the electron-source substrate 57 before forming step formed through steps 1 to 6 through a support frame 52 to manufacture a display panel 101. An exhaust pipe used for ventilation and exhaust is previously bonded to the support frame 52. In FIG. 5, the rear plate 51 and the electron-source substrate 57 are formed with different members. In case of this embodiment, however, the electron-source substrate 57 is directly joined with the support frame 52 without using a rear plate.

Step-8

After the inside of the panel is exhausted up to approx. $1.3 \times 10^{-5}$ Pa, "forming" is performed for each line by a manufacturing system capable of supplying a voltage between electrodes through the wirings 58 and 59. "Forming" conditions are the same as the case of the Embodiment 2.

Step-9

Acetone is introduced into the panel having a vacuum degree of $1.3 \times 10^{-5}$ Pa through an exhaust pipe up to $1.3 \times 10^{1}$ Pa and a voltage is applied to each device by a manufacturing system capable of supplying a voltage between electrodes from the wirings 58 and 59 through successive line scanning so that a pulse voltage same as the case of the Embodiment 1 is applied to execute the activating step. When a voltage is applied to each line for 25 min, each line has an average device current of 3 mA and the activating step is completed.

Step-10

Then, the panel is completely exhausted through the exhaust pipe to exhaust the panel 101 at 250° C. for 3 hr while heating the whole of the panel 101. Finally, a getter is flashed to seal the exhaust pipe.

A configuration of a driving circuit connected to an image-forming apparatus constituted by using an electron source in which a plurality of devices constituted as described above are arranged like a simple matrix in order to perform television display in accordance with an NTSC-type television signal will be described below by referring to FIG. 9.

In FIG. 9, reference numeral 101 denotes a display panel, 102 denotes a scanning circuit, 103 denotes a control circuit, 104 denotes a shift register, 105 denotes a line memory, 106 denotes a sync-signal separating circuit, 107 denotes a modulation signal generator, and Vx and Va denote DC voltage sources.

The display panel 101 connects with an external electric circuit through terminals Dox1 to Doxm, terminals Doy1 to Doyn, and high-voltage terminals Hv.

A scanning signal for successively driving electron sources set in the display panel 101, that is, a group of electron-emitting devices connected like a matrix of m columns and n rows (in case of this embodiment, m=150 and n=450) one column (n devices) by one column is applied to the terminals Dox1 to Doxm.

A modulation signal for controlling an output electron beam of each of electron-emitting devices for one column selected by the scanning signal is applied to the terminals Doy1 to Doyn.

A DC voltage of, for example, 10 k[V] is supplied to the high-voltage terminals Hv from the DC voltage source Va, which is an acceleration voltage for supplying the energy enough to excite a phosphor to an electron beam emitted from an electron-emitting device.

The scanning circuit 102 will be described below. The circuit 102 includes m switching devices (schematically shown by S1 to Sm in FIG. 9). Each switching device selects either of an output voltage and 0 [V] (ground level) of the DC voltage source Vx and is electrically connected with the terminals Dox1 to Doxm of the display panel 101. The switching devices S1 to Sm operate in accordance with a control signal Tscan output by the control circuit 103, which can be constituted by combining switching devices such as FETs.

The DC voltage source Vx is set so as to output a constant voltage so that a driving voltage to be applied to a device not scanned becomes equal to or lower than an electron-emitting threshold voltage in accordance with a characteristic (electron-emitting threshold voltage) of an electron-emitting device in case of this embodiment.

The control circuit 103 has a function for matching operations of various portions so that proper display is performed in accordance with a video signal input from an external unit. The control circuit 103 generates control signals Tscan, Tsft, and Tmry for various portions in accordance with a sync signal Tsync sent from the sync-signal separating circuit 106.

The sync-signal separating circuit 106 is a circuit for separating a sync-signal component and a brightness-signal component from an NTSC-type television signal input from an external unit, which can be constituted by using a general frequency-separating (filtering) circuit. A sync signal separated by the sync-signal separating circuit 106 comprises a vertical sync signal and a horizontal sync signal. However, the sync signal is illustrated as a Tsync signal for simplification of description. The brightness-signal component of the image separated from the television signal is shown as a DATA signal for convenience' sake. The DATA signal is input to the shift register 104.

The shift register 104 serial/parallel-converts the DATA signal serially input in time series every line of an image and operates in accordance with the control signal Tsft sent from the control circuit 103 (that is, the control signal Tsft can be also referred to as shift lock of the shift register 104). The serial/parallel-converted data for one line of an image (corresponding to driving data for n electron-emitting devices) is output from the shift register 104 as n parallel signal values of ld1 to ldn.

The line memory 105 is a memory for storing the data for one line of an image only for a necessary period and properly stores contents of ld1 to ldn in accordance with a control signal Tmry sent from the control circuit 103. The stored contents are output as video data values ld'1 to ld'n which are input to the modulation signal generator 107.

The modulation signal generator 107 is a signal source for properly driving and modulating each electron-emitting device in accordance with each of video data values ld'1 to ld'n and its output signal is applied to electron-emitting devices in the display panel 101 through the terminals Doy1 to Doyn.

In this case, modulation is performed in accordance with a pulse width modulation system. When executing the pulse width modulation system, it is possible to use a pulse-width-modulation-type circuit for generating a voltage pulse having a constant wave peak value and properly modulating the voltage pulse in accordance with input data as the modulation signal generator 107.

It is possible to use the digital signal type or analog signal type for the shift register 104 and line memory 105 because it is enough to perform serial/parallel conversion or storage of a video signal at a predetermined speed.

Electrons are emitted by applying a voltage to each electron-emitting device on a display panel by the above described driving circuit through out-of-vessel terminals Dox1 to Doxm and Doy1 to Doyn. An electron beam is accelerated by applying a high voltage to the metal back 55 through the high-voltage terminals Hv. The accelerated electrons run against the fluorescent film 54 and thereby, light is emitted and an image is formed.

The image-forming apparatus of this embodiment can be stably manufactured at a small brightness fluctuation, a high reproducibility, and a high yield.

Embodiment 5

An electron-emitting device having the configuration in FIGS. 1A and 1B is manufactured in accordance with the steps in FIGS. 2A to 2E. First, a glass substrate is used as an insulating substrate 1 and completely cleaned with an organic solvent and then, electrodes 2 and 3 made of platinum are formed on the substrate 1 (FIG. 2A). In this case, an electrode interval L is set to 50 μm, an electrode width W is set to 100 μm, and an electrode thickness d is set to 1000 Å.

Then, a treatment agent KF99 (made by Shin-Etsu Chemical Co., Ltd.) made of methylhydrogen polysiloxane is sprayed on the entire surface of the substrate 1 on which electrodes are formed and baked at 110° C. for 10 min to adjust surface energy.

Then, as a result of measuring a contact angle of the substrate whose surface energy is adjusted to water at 30 points on glass and platinum electrodes, the average of contact angles of the whole substrate shows 95° and the fluctuation of the contact angles shows 4%.

Comparative Example 1

As a result of measuring contact angles in the same manner as the case of the Embodiment 5 except that a treatment agent made of hexamethyldisilazane is used instead of the treatment agent KF99 made of methylhydrogen polysiloxane used for Embodiment 5, the fluctuation of contact angles of the whole substrate shows 13%.

Embodiment 6

An electron-emitting device having the configuration in FIGS. 1A and 1B is manufactured in accordance with the steps in FIGS. 2A to 2E. First, a glass substrate is used as an insulating substrate 1 and completely cleaned with an organic solvent and then, 100 pairs of electrodes 2 and 3 made of platinum are formed on the substrate 1 (FIG. 2A). In this case, an electrode interval L is set to 10 μm, an electrode width W is set to 500 μm, and an electrode thickness d is set to 1000 Å.

Then, the surface energy of the substrate 1 on which electrodes are formed is adjusted by spraying the treatment agent KF99 (made by Shin-Etsu Chemical Co., Ltd.) made of methylhydrogen polysiloxane on the entire surface of the substrate 1 and baking the substrate 1 at 110° C. for 10 min.

Then, a palladium-compound solution (ink) is manufactured by mixing and dissolving 1.0 wt % of tetramonoethanolamine-palladium-acetic-acid, 0.1 wt % of 88%-saponificated polyvinyl alcohol (average polymerization degree of 500), 1.0 wt % of ethylene glycol, and 30 wt % of 2-propanol in water and thereafter, filtering the solution with a membrane filter having a pore size of 0.25 μm.

Then, the bubble-jet printer head BC-01 (made by Canon Inc.) shown in FIG. 15 is filled with the above described ink, a DC voltage of 20 V is applied to a heater 222 in the head for 7 μsec from an external unit to supply the ink onto the insulating substrate 1 so as to connect the electrodes 2 and 3 (FIG. 2C).

Then, the ink supplied between the electrodes is heated in an oven at an atmospheric temperature of 350° C. for 15 min to form a conductive film 4 (FIG. 2C).

As a result of observing diameters of obtained conductive films 4 with an optical microscope, the average diameter of one hundred films shows 75 μm and their fluctuation shows 10%.

Embodiment 7

A treatment agent KF393 (made by Shin-Etsu Chemical Co., Ltd.) made of amino-denatured polysiloxane instead of the treatment agent KF99 is dripped and vibration-applied to the entire surface of the substrate 1 on which the electrodes 2 and 3 of the Embodiment 6 are formed to adjust the surface energy of the substrate 1.

Then, a palladium-compound solution (ink) is manufactured by mixing and dissolving 1.0 wt % of tetramonoethanolamine-palladium-acetic-acid, 0.05 wt % of 88%-saponificated polyvinyl alcohol (average polymerization degree of 500), 1.0 wt % of ethylene glycol, and 20 wt % of 2-propanol in water and thereafter, filtering the solution with a membrane filter having a pore size of 0.25 μm.

Then, the above described ink is injected into a ejection head of the piezo jet printer FP510 (made by Canon Inc.) shown in FIG. 16, 30 VDC is applied for 5 μsec from an external unit, and a palladium-compound solution is ejected to the gap between the electrodes 2 and 3 on the glass substrate (FIG. 2B).

Conductive films 4 are formed by heating the glass substrate in an oven at an atmospheric temperature of 350° C. for 15 min and dissolving and depositing the ink supplied onto the substrate on the substrate (FIG. 2C).

As a result of measuring diameters of the obtained conductive films 4 with an optical microscope similarly to the case of the Embodiment 6, the average diameter of 100 films shows 64 μm and their fluctuation shows 9%.

Embodiment 8

Surface energy of a substrate 1 on which the electrodes 2 and 3 of the Embodiment 6 are formed is adjusted by spraying a treatment agent obtained by dissolving 1 wt % of a treatment agent KF852 (made by Shin-Etsu Chemical Co., Ltd.) made of amino-denatured polysiloxane in 20 wt % of an aqueous solution of IPA and adding 0.1 wt % of acetic acid to the agent on the entire surface of the substrate 1.

Then, a palladium-compound solution (ink) is manufactured by mixing and dissolving 1.0 wt % of tetramonoethanolamine-palladium-acetic-acid, 0.05 wt % of 88%-saponificated polyvinyl alcohol (average polymerization degree of 500), 1.0 wt % of ethylene glycol, and 15 wt % of 2-propanol in water and thereafter, filtering the solution with a membrane filter having a pore size of 0.25 μm.

Then, the above described ink is supplied to the gap between the electrodes 2 and 3 on the glass substrate by injecting the ink into an ejection head of the piezo jet printer FP510 (made by Canon Inc.) shown in FIG. 16 and applying 30-VDC voltage for 5 μsec from an external unit (FIG. 2B).

Then, conductive films 4 are formed by heating the glass substrate in an oven of 350° C. for 15 min in the air and dissolving and depositing droplets supplied onto the substrate (FIG. 2C).

As a result of observing lengths of obtained electron-emitting devices, that is, diameters of conductive films 4 with an optical microscope similarly to the case of the Embodiment 6, the average diameter of 100 conductive films 4 shows 78 μm and their fluctuation shows 9%.

Embodiment 9

"Forming" is performed by setting the substrate formed for the Embodiment 6 in the vacuum vessel 65 shown in FIG. 6, applying a voltage between electrodes 2 and 3, and supplying a current to each conductive film 4. In this step, a second gap 6 is formed on each conductive film 4 (FIG. 2D).

FIG. 3 shows voltage waveforms in the "forming" step used for this embodiment. In FIG. 3, reference numeral T1 denotes a pulse width of a voltage waveform and T2 denotes a pulse interval between voltage waveforms. In case of this embodiment, T1 is set to 1 msec, T2 is set to 10 msec, a triangular-wave peak value (peak voltage for forming) is set to 5 V, and forming is performed in a vacuum atmosphere of approx. $1 \times 10^{-4}$ Pa for 60 sec.

Then, activation is performed by introducing benzonitrile up to $1 \times 10^{-3}$ Pa and applying a voltage between electrodes 2 and 3 to form a carbon film 10 on each device (FIG. 2E). The pulse waveform in the above described case has the waveform shown in FIG. 4 and its pulse width is set to 1 msec and its pulse interval is set to 10 msec to apply a voltage of ±18 V. Thereafter, the inside of the vacuum vessel 65 is exhausted up to $1 \times 10^{-6}$ Pa.

As a result of applying a device voltage of 15 V between electrodes 2 and 3 on each of 100 devices manufactured as described above, measuring a device current If then flowing between the electrodes 2 and 3 and an emission current Ie acquired by an anode electrode 64, and thereby evaluating electron-emitting characteristics, a preferable electron-emitting characteristic having a high uniformity is obtained.

Then, a face plate having a fluorescent film and a metal back is set in the vacuum vessel 65 instead of the anode electrode 64. As a result of trying electron emission from an electron source, a fluorescent film corresponding to each electron-emitting device emits light and intensities of emitted light are changed correspondingly to the device current If. Thus, it is found that each device functions as a light-emitting display device. Moreover, it is found that a luminescent spot formed on each fluorescent film has a high uniformity and a temporal change of brightness is small.

Embodiment 10

The image-forming apparatus shown in FIG. 5 is constituted by using the substrate before the "forming" step formed for the Embodiment 7. The apparatus is sealed by setting the substrate 57 before the "forming" step formed for the Embodiment 7 onto a rear plate 51, setting a face plate 56 on which a fluorescent film 54 and a metal back 55 are formed to a position 3 mm upper than the substrate 57 through the support frame 52, applying frit glass to a joint, and baking the apparatus in the air at 400° C. for 10 min.

Then, a second gap is formed on each conductive film 4 by exhausting the atmosphere in the finished vessel 101 by a vacuum pump through a not-illustrated exhaust pipe, applying a voltage between electrodes 2 and 3 by using out-of-vessel terminals after a high-enough vacuum degree is obtained, and electrifying (forming) each conductive film (FIG. 2D).

Then, activation is performed by introducing benzonitrile into the vessel 101 up to $1 \times 10^{-3}$ Pa and applying a voltage between electrodes 2 and 3. The activation uses a pulse having the waveform shown in FIG. 4. Moreover, the then pulse width is set to 1 msec, the then pulse interval is set to 10 sec, and a voltage of ±18 V is applied for 1 hr.

Then, an envelope 101 is sealed by welding a not-illustrated exhaust pipe by a gas burner.

Then, an image is displayed by applying a voltage to each electron-emitting device 50 through out-of-vessel terminals (Dx1 to Dxm and Dy1 to Dyn) to make each electron-emitting device 50 emit electrons and each fluorescent film of the face plate emit light. As a result, an image superior in uniformity is obtained for a long time.

Embodiment 11

FIG. 5 and FIGS. 13A to 13C and 14D to 14F show the image-forming apparatus of this embodiment.
(1) Device Electrode Forming Step S1

First, as shown in FIG. 13A, device electrodes 2 and 3 are formed on a glass substrate 57. In this case, a device-electrode interval is set to approx. 20 μm and a device-electrode width is set to 125 μm.

The device electrodes 2 and 3 shown in FIG. 13A are formed by previously completely cleaning the substrate 57 with a detergent, demineralized water, and an organic solvent, then forming the device electrode material into a film, and patterning the film in accordance with the photolithography method.
(2) Wiring Forming Step S2

Then, an X-directional wiring 58 is formed in accordance with the screen printing method by using an Ag paste ink (trade name: NP-4035C made by NORITAKE CO., LTD.) as the wiring material.

Then, a layer-insulating layer 81 is formed by printing it up to a thickness of approx. 20 μm in accordance with the screen printing method and baking it at 400° C. for 60 min (FIG. 13C).

Moreover, a Y-directional wiring 59 is formed in accordance with the screen printing method by using the Ag paste ink as the wiring material (FIG. 13D).
(3) Substrate Surface Treating Step S3

Then, surface treatment of the glass substrate 57 is executed. In this case, a demineralized-water solution is prepared which serves as a water-based treatment agent containing at least an organic silicon compound and an acid, specifically serves as a water-based treatment agent containing 0.5 wt % of polysiloxane containing an amino group (trade name: KF-857 made by Shin-Etsu Chemical Co., Ltd.) as the above described organic silicon compound and 0.1 wt % of acetic acid as the above described acid, and used as a treatment solution A.

Then, the glass substrate 57 is running-water-cleaned with demineralized water for 10 min in a cleaning vessel and then soaked in a treatment vessel filled with the treatment solution A for 3 min to adjust surface energy.

Thereafter, the glass substrate 57 is taken out of the treatment vessel to remove the treatment solution from the surface of the substrate by blowing dry air on the surface.
(4) Conductive-film Forming Step S4

Then, as shown in FIG. 14E, a conductive film 4 is formed between the electrodes 2 and 3.

To form the conductive film 4, an organic-metal solution (ink) is first prepared. The organic-metal solution is a solution of an organic metal compound mainly containing a material used for the conductive film 4 as a main element. Specifically, a light-yellow solution is obtained by dissolving palladium-acetate-monoethanolamine complex {Pd(NH$_2$CH$_2$CH$_2$OH)$_4$(CH$_3$COO)$_2$} in an aqueous solution in which a molality of 0.5% of polyvinyl alcohol, a molality of 15% of 2-propanol, and a molality of 1% of ethylene glycol are dissolved so that a palladium molality becomes approx. 0.15%.

Droplets of the above described solution (ink) are supplied to the electrodes 2 and 3 four times each so as to connect the electrodes 2 and 3 each other in accordance with the ink jet method. Thereafter, the glass substrate 31 is baked in a kiln at 350° C. for 30 min to form a conductive film 4 (FIG. 14E).

As a result of measuring a resistance of each conductive film 4 formed as described above, a conductive film 4 having a high uniformity is formed because surface energies of the electrodes 2 and 3 and glass substrate 57 are controlled to desired values through surface treatment but a conductive film 4 having a high resistance due to the flow of dots or popping is not found.

(5) Face-plate Forming Step S5

Then, a face plate 56 is manufactured.

The face plate 56 is constituted so that a fluorescent film 54 in which phosphors are arranged and a metal back 55 covering the fluorescent film 54 are formed on the inner surface of a glass substrate 53. The phosphors are arranged so that a black stripe is present between three-primary-color phosphors. These are formed in accordance with the screen printing method.

(6) Sealing Step S6

The glass substrate 57 formed through the above described steps (1) to (4) is fixed to a rear plate 51. Then, the rear plate 51 is joined (sealed) with the face plate 56 through a support frame 52 to form a vessel 101. An exhaust pipe (not illustrated) used for ventilation/exhaust is previously bonded to the support frame 52.

(7) "Forming" Step S7

Then, the inside of the vessel 101 is exhausted up to $1 \times 10^{-7}$ Torr and then, a voltage is applied between the device electrodes 2 and 3 from a power supply to form a second gap.

(8) "Activating" Step S8

Then, a voltage is applied between the device electrodes 2 and 3. According to the activation step, a carbon film is formed in the second gap and a conductive film 4 nearby the second gap and an electron-emitting portion 5 is formed on each conductive film 4 (FIG. 14F). By performing the activation step, electron-emitting characteristics are improved.

(9) Exhaust Pipe Sealing Step S9

Then, after exhaust is sufficiently performed through an exhaust pipe, the vessel 101 is exhausted while heating the whole of the vessel 101 at 250° C. for 3 hr. Finally, a getter is flashed to seal the exhaust pipe.

Thus, the display panel 101 of the image-forming apparatus shown in FIG. 5 is manufactured and the image-forming apparatus is completed by connecting the driving circuit shown in FIG. 9 with wirings.

By applying a predetermined voltage to devices through terminals Dox1 to Doxm and terminals Doy1 to Doyn in time sharing by the image-forming apparatus and applying a high voltage to a metal back 19 through terminals Hv, it is possible to display an optional matrix image pattern. The image-forming apparatus of this embodiment makes it possible to obtain a high-uniformity image for a long time.

Embodiment 12

A conductive-film-forming metal-composition (ink) preparing method of this embodiment will be described below.

N-methyl-2-pyrolidone is added to 0.5 g of palladium acetate until the total weight reaches 100 g and mixed and dissolved. The metal composition (ink) of the embodiment is obtained by filtering the palladium-compound solution with a membrane filter having a pore size of 0.25 μm. The N-methyl-2-plyrolidone has a surface tension of 41 dyn/cm and a viscosity of 1.7 cP at 25° C.

As a result of injecting the ink of this embodiment into the bubble-jet-printer head BC-01 (made by Canon Inc.) shown in FIG. 15, applying 20 VDC to a predetermined in-head heater 222 from an external unit for 7 μsec to make the head eject droplets, and observing an ejection state with a CCD camera from a side of the ejection head, it is found that scores of thousands of droplets are preferably ejected.

Then, as a result of storing the metal composition (ink) of this embodiment at 30° C. for one month and then evaluating the stability of the ink, it is found that the ink stability is preferable because color change of the appearance is not observed or deposit is not visually observed.

Comparative Example 2

A metal deposition (ink) of this comparative example is prepared similarly to the case of the Embodiment 12 except that ethyl acetate is used instead of N-methyl-2-pyrolidone used for the ink prepared for the Embodiment 12.

The ethyl acetate has a surface tension of 24 dyn/cm and a viscosity of 0.4 cP at 25° C.

As a result of injecting a metal composition of the comparative example 1 into the bubble jet printer head BC-01 and discharging droplets similarly to the case of the Embodiment 12, the metal composition drips from the front end of the printer head and a liquid pool is formed and thereby, no droplet is ejected though applying an ejection voltage.

Comparative Example 3

Water is added to 0.66 g of tetramonoethanolamine-palladium acetic acid until the weight of the mixture reaches 100 g and mixed and dissolved. The metal composition (ink) of this comparative example is obtained by filtering the palladium compound solution with a membrane filter having a pore size of 0.25 μm. As a result of storing the metal composition of this comparative example at 30° C. for one month similarly to the case of the Embodiment 12 and evaluating the stability, it is found that the appearance is changed from thin lemon color to black color and deposit is visually observed. As a result of discharging the ink from the ink jet system used for the Embodiment 12, it is found that an ejection quantity is unstable.

Embodiment 13

A method for preparing the conductive-film-forming metal composition (ink) used for this embodiment will be described below.

Pyridine is added to 0.5 g of nickel acetate so that the weight of the mixture reaches 100 g and mixed and dissolved. The metal composition (ink) of this embodiment is obtained by filtering the nickel-compound solution with a membrane filter having a pore size of 0.25 μm. Pyridine has a surface tension of 36 dyn/cm and a viscosity of 0.9 cP at 25° C.

A metal composition of this embodiment is injected into the ejection head of the piezo jet printer FP510 (made by Canon Inc.) shown in FIG. 16 and 30 VDC is applied from an external unit for 5 μsec to elected droplets from the election head. As a result of observing the above described state by a CCD camera from a side of the ejection head similarly to the case of the Embodiment 12, it is found that scores of thousands of droplets are preferably ejected.

Then, as a result of storing the metal composition of this embodiment at 30° C. for one month similarly to the case of the Embodiment 12 and evaluating the stability, it is found that the ink stability is preferable because color change of the appearance is not observed or deposit is not visually observed.

Comparative Example 4

The metal composition (ink) of this comparative example is prepared similarly to the case of the Embodiment 13 except that butyl acetate is used instead of pyridine used for the Embodiment 13. The butyl acetate has a surface tension of 25 dyn/cm and a viscosity of 0.7 cP at 25° C.

A metal composition of this comparative example is injected into the ejection head of the piezo jet printer FP510 (made by Canon Inc.) to attempt ejection of droplets similarly to the case of the Embodiment 13. Then, as a result of observing the above described state, ejection is unstable and droplets are not ejected in some cases though applying an ejection voltage.

Embodiment 14

A conductive-film-forming metal composition (ink) preparing method of this embodiment will be described below.

Pyrrole is added to 0.32 g of palladium acetate so that the weight of the mixture reaches 100 g and mixed and dissolved. A metal composition (ink) of this embodiment is obtained by filtering the palladium-compound solution with a membrane filer having a pore size of 0.25 $\mu$m. The pyrrole has a surface tension of 37 dyn/cm and a viscosity of 1.2 cP at 25° C.

The metal composition of this embodiment is injected into the ejection head of the piezo jet printer FP510 (made by Canon Inc.) shown in FIG. 16 and 30 VDC is applied from an external unit for 5 $\mu$sec to ejected droplets. As a result of observing the ejection state from a side of the ejection head by a CCD camera similarly to the case of the Embodiment 12, it is found that tens of thousands of droplets are preferably ejected.

Then, as a result of storing the metal composition of this embodiment at 30° C. for one month similarly to the case of the Embodiment 12 and evaluating the stability, it is found that color change of the appearance is not observe or deposit is not visually observed and the stability of the ink is preferable.

Comparative Example 5

A metal composition (ink) of this comparative example is prepared similarly to the case of the Embodiment 14 except that dibutyl amine is used instead of pyrrole used for the Embodiment 14. The dibutyl amine has a surface tension of 25 dyn/cm and a viscosity of 1.0 cP at 25° C.

As a result of injecting the metal composition of this comparative example into the ejection head of the piezo jet printer FP510 (made by Canon Inc.) and discharging droplets similarly to the case of the Embodiment 14, it is found that the metal composition drips from the front end of the printer head and a liquid pool is formed and thereby, no droplet is ejected though applying an ejection voltage.

Embodiment 15

A conductive-film-forming metal-composition (ink) preparing method of this embodiment will be described below.

Morpholine is added to 0.3 g of palladium acetate so that the weight of the mixture reaches 100 g and mixed and dissolved. A metal composition (ink) used for this embodiment is obtained by filtering the palladium-compound solution with a membrane filter having a pore size of 0.25 $\mu$m. The morpholine has a surface tension of 38 dyn/cm and a viscosity of 2.2 cP at 25° C.

The metal composition is injected into the ejection head of the piezo jet printer FP510 (made by Canon Inc.) shown in FIG. 16 and 30 VDC is applied for 5 $\mu$sec to ejected droplets. As a result of observing the above described state with a CCD camera from a side of the ejection head similarly to the case of the Embodiment 14, it is found that tens of thousands of droplets are preferably ejected.

Then, as a result of storing the metal composition of this embodiment at 30° C. for one month similarly to the case of the Embodiment 12, it is found that color change of the appearance is not observed or deposit is not visually observed and the stability of the ink is preferable.

Comparative Example 6

A metal composition (ink) of this comparative example is prepared similarly to the case of the Embodiment 15 except that isobutyl acetate is used instead of morpholine used for the Embodiment 15. The isobutyl acetate has a surface tension of 23 dyn/cm and a viscosity of 0.65 cP at 25° C.

As a result of injecting the metal composition of this comparative example into the ejection head of the piezo jet printer FP510 (made by Canon Inc.) and discharging droplets similarly to the case of the Embodiment 15, the metal composition drips from the front end of the printer head and a liquid pool is formed and thereby, no droplet is ejected through applying an ejection voltage.

Embodiment 16

The electron-emitting device of the type shown in FIGS. 1A and 1B is manufactured as the electron-emitting device of this embodiment.

An electron-emitting-device manufacturing method of this embodiment will be described below by referring to FIGS. 2A to 2E.

A glass substrate is used as an insulating substrate 1 and completely cleaned with an organic solvent to form device electrodes 2 and 3 made of platinum on the surface of the substrate 1 (FIG. 2A). In this case, a device electrode interval is set to 10 $\mu$m, a device electrode width is set to 500 $\mu$m, and a device electrode thickness is set to 1000 Å.

The ink of the Embodiment 12 is injected into the bubble jet printer head BC-01 (made by Canon Inc.) shown in FIG. 15 and 20-VDC is applied to a heater 222 in a predetermined head from an external unit for 7 $\mu$sec to form a film on the insulating substrate 1 between the device electrodes 2 and 3 (FIG. 2B).

The film is heated in an oven at 350° C. in the atmosphere of air for 15 min and the ink is dissolved and deposited on the substrate to form a conductive film 4 (FIG. 2C).

Then, the substrate on which the conductive film 4 is formed is set in the vacuum vessel 65 in FIG. 6 to exhaust the inside of the vessel 65 by a vacuum pump 67. After the inside reaches a high-enough vacuum degree, a second gap 6 is formed by using out-of-vessel terminals and thereby, applying a voltage between the device electrodes 2 and 3 and applying energization (forming) to the conductive film 4 (FIG. 2D).

FIG. 3 shows voltage waveforms for "forming". In FIG. 3, T1 denotes a pulse width of a voltage waveform and T2 denotes a pulse interval between voltage waveforms. In case of this embodiment, T1 is set to 1 msec, T2 is set to 10 msec, a triangular-wave peak value (peak voltage for forming) is set to 5 V, and "forming" is executed for 60 sec.

Then, an electron-emitting portion 5 is formed by introducing benzonitrile into a vacuum vessel up to approx. $1.3 \times 10^{-4}$ Pa at room temperature, applying a voltage between device electrodes to perform activation, and forming a carbon film 10 and a first gap 7.

As a result of applying a device voltage between the electrodes 2 and 3, applying a high voltage Va to the anode electrode 64, measuring a device current If and emission current Ie flowing at this time, and evaluating an electron-emitting characteristic of the device manufactured as described above, it is found that a preferable electron-emitting characteristic is obtained.

Then, a face plate having the above described fluorescent film and metal back instead of the anode electrode 64 is set in the vacuum vessel 65.

As a result of attempt to emit electrons from the electron-emitting device, a part of the fluorescent film emits light and intensities of the emitted light are changed in accordance with the device current Ie. Moreover, it is found that the electron-emitting characteristic of the device of this embodiment is preferable and stable for a long time.

Embodiment 17

A glass substrate is used as an insulating substrate 1 to form a device electrode made of Pt similarly to the Embodiment 16.

Then, the metal composition (ink) of the Embodiment 15 is injected into the ejection head of the piezo jet printer FP510 (made by Canon Inc.) and 30 VDC is applied from an external unit for 5 μsec to supply the ink to the gap between the device electrodes 2 and 3. The substrate is heated at 350° C. for 12 min to form a conductive film 4 made of palladium oxide.

As a result of executing predetermined "forming" step and "activating" step and evaluating an electron-emitting device similarly to the case of the Embodiment 16, a preferable electron-emitting characteristic is obtained similarly to the case of the Embodiment 16.

Embodiment 18

In case of this embodiment, the image-forming apparatus shown in FIG. 5 is manufactured.

In case of this embodiment, the ink manufactured for the Embodiment 16 is used, 240 conductive films 4 wired like a matrix are vertically arranged and 720 conductive films 4 wired like a matrix are horizontally arranged on a glass substrate as shown in FIGS. 8A and 8B and resultantly, the total of 172,800 conductive films 4 are formed. All conductive films 4 are formed at a high uniformity without causing drips or imperfect ejection of a metal composition while the metal composition is ejected by a piezo jet printer.

Then, a vessel 101 is formed by fixing a glass substrate 57 thus manufactured on a rear plate 51 and then, setting a face plate 56 on which a fluorescent film 54 and a metal back 55 are formed to a position 3 mm higher than the rear plate 51 through a support frame, applying frit glass to a joint, and baking them at 400° C. for 10 min in the air to seal them.

Then, a second gap 6 is formed as shown in FIG. 2D by exhausting the inside of the completed glass vessel 101 by a vacuum pump through an exhaust pipe and after the inside of the vessel 101 reaches a high-enough vacuum degree, applying a voltage between electrodes 2 and 3 by using out-of-vessel terminals, and electrifying (forming) each conductive film 4.

Moreover, a carbon film 10 and an electron-emitting portion 5 are formed on each device as shown in FIG. 2E by introducing benzonitrile into the vessel 101 and applying a voltage between the electrodes 2 and 3 through out-of-vessel terminals.

Then, an image-forming apparatus of the present invention is constituted by heating an exhaust pipe with a gas burner at a vacuum degree of approx. $1 \times 10^{-6}$ Torr and thereby welding the pipe to seal the envelop 101.

In the completed image-forming apparatus of the present invention, as a result of applying a voltage to each electron-emitting device through out-of-vessel terminals to emit electrons and applying a high voltage of several kilovolts or higher through high-voltage terminals to display an image, a display image at a high uniformity can be obtained for a long time.

As described above, the present invention makes it possible to control spread of droplets of a liquid containing a conductive-film-forming material. Moreover, the present invention makes it possible to manufacture conductive films in a small shape fluctuation at a high stability and reproducibility. As a result, it is possible to provide an electron-emitting device having a preferable electron-emitting characteristic, an electron source in which a plurality of preferable electron-emitting devices at a high uniformity are arranged, and an image-forming apparatus having a preferable display quality at a high uniformity.

Moreover, according to the present invention, it is possible to inexpensively form conductive films at a high yield and as a result, it is possible to provide inexpensive electron-emitting devices, electron sources, and image-forming apparatuses at a high yield.

What is claimed is:

1. Ink used for an ink jet, comprising:
   a solvent containing nitrogen serving as a main solvent; and
   a metallic element or a semiconductor element,
   wherein the metallic element is present as a carboxylic-acid metallic salt shown by the following general expression (1):

$$(C_nH_{(2n+1)}COO)_mM \tag{1}$$

where M denotes the metallic element, n denotes an integer of 0 to 30, and m denotes an integer of 1 to 4.

2. The ink used for an ink jet according to claim 1, wherein metallic element is a platinum-group element.

3. The ink used for an ink jet according to claim 1, wherein carboxylic acid of the carboxylic-acid metallic salt has n of 0 to 3 in the general expression (1).

4. Ink used for an ink jet, comprising:
   a solvent containing nitrogen serving as a main solvent; and
   a metallic element or a semiconductor element,
   wherein the solvent containing nitrogen included in the ink is 50 wt % or more.

5. The ink used for an ink jet according to any one of claims 1–4, wherein the solvent containing nitrogen has a surface tension of 30 dyn/cm or more at a temperature of 25° C.

6. The ink used for an ink jet according to any one of claims 1–4, wherein the solvent containing nitrogen uses at least one of morpholine, N-methylmorpholine, N-ethylmorpholine, pyridine, pyrrole, N-methyl-2-pyrolidone, and monoethanolamine.

7. A conductive-film manufacturing method, comprising the steps of:
(A) preparing a substrate;
(B) supplying a liquid containing a metallic element of a platinum group or a semiconductor element onto the substrate, the liquid further containing a main solvent including nitrogen; and
(C) forming a conductive film by baking the substrate to which the liquid has been supplied, wherein the liquid includes the metallic element present as a carboxylic-acid metallic salt shown by the following general expression (1):

$(C_nH_{2n+1}COO_m)M$  (1)

wherein M denotes the metallic element, n denotes an integer of 0 to 30, and m denotes an integer of 1 to 4.

8. The conductive-film manufacturing method according to claim 7, wherein carboxylic acid of the carboxylic-acid metallic salt has n of 0 to 3 in the general expression (1).

9. A conductive-film manufacturing method, comprising the steps of:
(A) preparing a substrate;
(B) supplying a liquid containing a metallic element of a platinum group or a semiconductor element onto the substrate; and
(C) forming a conductive film by baking a substrate to which the liquid is supplied, wherein the liquid uses a solvent containing nitrogen as a main solvent, and wherein the solvent containing nitrogen included in the liquid is 50 wt % or more.

10. The conductive-film manufacturing method according to any one of claims 7, 8 or 9, wherein the solvent containing nitrogen has a surface tension of 30 dyn/cm or more at a temperature of 25° C.

11. The conductive-film manufacturing method according to any one of claims 7, 8 or 9, wherein the solvent containing nitrogen uses at least one of morpholine, N-methylmorpholine, N-ethylmorpholine, pyridine, pyrrole, N-methyl-2-pyrolidone, and monoethanolamine.

12. The conductive-film manufacturing method according to any one of claims 7, 8 or 9, wherein the liquid is supplied onto the substrate in accordance with the ink jet method.

13. The conductive-film manufacturing method according to any one of claims 7, 8 or 9, wherein the step of preparing a substrate includes the step of adjusting surface energy of the surface of the substrate.

14. The conductive-film manufacturing method according to claim 13, wherein the step of adjusting surface energy includes the step of bringing a solution containing polysiloxane or a solution containing an organic silicon compound and an acid into contact with the substrate.

15. The conductive-film manufacturing method according to claim 14, wherein the step of bringing a solution containing polysiloxane or a solution containing an organic silicon compound and an acid into contact with the substrate is the step of soaking the substrate in the solution containing polysiloxane or the solution containing an organic silicon compound and an acid.

16. An electron-emitting-device manufacturing method comprising the steps of:
(A) the step of supplying a liquid containing a metallic element or a semiconductor element so as to connect a pair of electrodes arranged on a substrate to each other;

(B) the step of forming a conductive film by baking the substrate to which the liquid is supplied; and
(C) the step of forming an electron-emitting portion by applying a voltage between the electrodes,
wherein the liquid comprises a solvent containing nitrogen as a main solvent.

17. The electron-emitting-device manufacturing method according to claim 16, wherein the metallic element is present as a carboxylic-acid metallic salt shown by the following general expression (1):

$(C_nH_{(2n+1)}COO)_mM$  (1)

where M denotes the metallic element, n denotes an integer of 0 to 30, and m denotes an integer of 1 to 4.

18. The electron-emitting-device manufacturing method according to claim 17, wherein the metallic element is a platinum-group element.

19. The electron-emitting-device manufacturing method according to claim 17, wherein carboxylic acid of the carboxylic-acid metallic salt has n of 0 to 3 in the general expression (1).

20. The electron-emitting-device manufacturing method according to claim 16, wherein the solvent containing nitrogen included in the liquid is 50 wt % or more.

21. The electron-emitting-device manufacturing method according to claim 16, wherein the solvent containing nitrogen has a surface tension of 30 dyn/cm or more at a temperature of 25° C.

22. The electron-emitting-device manufacturing method according to claim 16, wherein the solvent containing nitrogen uses at least one of morpholine, N-methylmorpholine, N-ethylmorpholine, pyridine, pyrrole, N-methyl-2-pyrolidone, and monoethanolamine.

23. The electron-emitting-device manufacturing method according to any one of claims 16 to 22, wherein the liquid is supplied onto the substrate in accordance with the ink jet method.

24. The electron-emitting-device manufacturing method according to any one of claims 16 to 22, wherein the step of adjusting surface energy of the surface of the substrate is included before the step of supplying a liquid onto the substrate.

25. The electron-emitting-device manufacturing method according to claim 24, wherein the step of adjusting the surface energy includes the step of bringing a solution containing polysiloxane or a solution containing an organic silicon compound and an acid into contact with the substrate.

26. The electron-emitting-device manufacturing method according to claim 25, wherein the step of bringing the solution containing polysiloxane or the solution containing an organic silicon compound and an acid into contact with the substrate is the step of soaking the substrate in the solution containing polysiloxane or the solution containing an organic silicon compound and an acid.

27. A method for manufacturing an electron source formed by arranging a plurality of electron-emitting devices on a substrate, wherein the electron-emitting devices are formed in accordance with the manufacturing method of any one of claims 16 to 22.

28. A method for manufacturing an image-forming apparatus having an electron source and an image-forming member, wherein the electron source is formed in accordance with the manufacturing method of claim 27.

29. An electron-emitting-device manufacturing method comprising the steps of:
(A) the step of forming first and second electrodes on a substrate;

(B) the step of bringing a solution containing polysiloxane or a solution containing an organic silicon compound and an acid into contact with the substrate;

(C) the step of supplying a liquid containing a conductive-film-forming material so as to connect the first and second electrodes to each other;

(D) the step of forming a conductive film by baking the substrate to which the liquid has been supplied; and (E) the step of forming an electron-emitting portion by applying a voltage between the first and second electrodes.

30. The electron-emitting-device manufacturing method according to claim 29, wherein the polysiloxane uses at least one of dimethylpolysiloxane, methylphenylpolysiloxane, methylhydrogen polysiloxane, amino-denatured polysiloxane, epoxy-denatured polysiloxane, carboxyl-denatured polysiloxane, methacryl-denatured polysiloxane, phenol-denatured polysiloxane, polyether-denatured polysiloxane, alkyl-denatured polysiloxane, and methyl-styryl-denatured polysiloxane.

31. The electron-emitting-device manufacturing method according to claim 29, wherein the polysiloxane has an amino group.

32. The electron-emitting-device manufacturing method according to claim 29, wherein the acid uses at least one of formic acid, acetic acid, propionic acid, butyric acid, lactic acid, citric acid, adipic acid, tartaric acid, succinic acid, malic acid, ascorbic acid, gluconic acid, oxalic acid, malonic acid, maleic acid, fumaric acid, and nitric acid.

33. The electron-emitting-device manufacturing method according to claim 29, wherein the organic silicon compound uses at least one of denatured polysiloxane, amino-denatured polysiloxane, and aminoalkoxy-denatured polysiloxane.

34. The electron-emitting-device manufacturing method according to any one of claims 29 to 33, wherein the liquid is supplied onto the substrate in accordance with the ink jet method.

35. The electron-emitting-device manufacturing method according to any one of claims 29 to 33, wherein the step of bringing the solution containing polysiloxane or the solution containing an organic silicon compound and an acid into contact with the substrate is the step of soaking the substrate in the solution containing an organic silicon compound and an acid.

36. A conductive-film manufacturing method comprising the steps of:

(A) preparing a substrate;

(B) supplying a solution containing polysiloxane or a solution containing an organic silicon compound and an acid onto the substrate;

(C) supplying a liquid containing a conductive-film-forming material onto the substrate to which the solution has been supplied; and (D) forming a conductive film by baking the substrate to which the solution has been supplied, wherein the polysiloxane has an amino group.

37. A conductive-film manufacturing method comprising the steps of:

(A) preparing a glass substrate;

(B) supplying a solution containing polysiloxane or a solution containing an organic silicon compound and an acid onto the substrate;

(C) supplying a liquid containing a conductive-film-forming material onto the substrate; and (D) forming a conductive film by baking the substrate to which the solution has been supplied, wherein the polysiloxane has an amino group, and wherein the acid uses at least one of formic acid, acetic acid, propionic acid, butyric acid, lactic acid, citric acid, adipic acid, tartaric acid, succinic acid, malic acid, ascorbic acid, gluconic acid, oxalic acid, malonic acid, maleic acid, fumaric acid and nitric acid.

38. The conductive film manufacturing method according to claims 36 or 37, wherein the polysiloxane uses at least one of dimethylpolysiloxane, methylphenylpolysiloxane, methylhydrogen polysiloxane, amino-denatured polysiloxane, epoxy-denatured polysiloxane, carboxyl-denatured polysiloxane, methacryl-denatured polysiloxane, phenol-denatured polysiloxane, polyether-denatured polysiloxane, alkyl-denatured polysiloxane, and methyl-styryl-denatured polysiloxane.

39. The conductive film manufacturing method according to claims 36 or 37, wherein the organic silicon compound uses at least one of denatured polysiloxane, amino-denatured polysiloxane, and amino-alkoxy-denatured polysiloxane.

40. The conductive film manufacturing method according to any one of claims 36 or 37, wherein the liquid is supplied onto the substrate in accordance with the ink jet method.

41. The conductive film manufacturing method according to any one of claims 36 or 37, wherein the step of bringing the solution containing polysiloxane or the solution containing an organic silicon compound and an acid into contact with the substrate is the step of soaking the substrate in the solution containing an organic silicon compound and an acid.

42. An electron-emitting-device manufacturing method comprising the steps of:

(A) the step of forming first and second electrodes on a substrate;

(B) the step of controlling a contact angle of the surface of the substrate for water to 70° or more;

(C) the step of supplying a liquid containing a conductive-film-forming material so as to connect the first and second electrodes on the substrate to each other;

(D) the step of forming a conductive film by baking the substrate to which the liquid is supplied; and (E) the step of forming an electron-emitting portion by applying a voltage between the first and second electrodes.

43. The electron-emitting device manufacturing method according to claim 42, wherein the step (B) includes a step of exposing the substrate to a vapor containing a material for controlling the contact angle of the surface of the substrate for water.

44. The electron-emitting-device manufacturing method according to claim 42, wherein the liquid is supplied onto the substrate in accordance with the ink jet method.

45. The electron-emitting-device manufacturing method according to claim 42, wherein the liquid has a surface tension of 30 dyne/cm or less.

46. A conductive film manufacturing method comprising the steps of:

(A) the step of preparing a substrate;

(B) the step of controlling a contact angle of the surface of the substrate for water to 70° or more;

(C) the step of supplying a liquid containing a conductive-film-forming material onto the substrate; and (D) the step of forming a conductive film by baking the substrate to which the liquid has been supplied.

47. The conductive film manufacturing method according to claim 46, wherein the liquid is supplied onto the substrate in accordance with the ink jet method.

48. The conductive film manufacturing method according to claim 46, wherein the step (B) includes a step of exposing the substrate to a vapor containing a material for controlling the contact angle of the surface of the substrate for water.

49. The conductive film manufacturing method according to claim 46, wherein the liquid has a surface tension of 30 dyne/cm or less.

50. An electronic-device manufacturing method comprising the steps of:
   (A) providing a liquid containing a platinum-group element for constituting the electronic-device;
   (B) applying the liquid to a substrate,
   wherein the liquid comprises a solvent containing nitrogen as a main solvent and wherein the solvent containing nitrogen is present in the liquid in amounts of 50 wt. % or more.

51. An electronic-device manufacturing method comprising the steps of:
   (A) preparing a substrate;
   (B) bringing a solution containing polysiloxane or a solution containing an organic silicon compound and an acid into contact with the substrate; and
   (C) applying a liquid containing a material for constituting the electronic-device to the substrate,
   wherein the liquid comprises a solvent containing nitrogen as a main solvent, and wherein step (C) is performed after step (B) is completed.

52. An electronic-device manufacturing method comprising the steps of:
   (A) preparing a substrate;
   (B) controlling a contact angle of a surface of the substrate for water to 70° or more; and
   (C) applying a liquid containing a material for constituting the electronic-device to the substrate,
   wherein the liquid comprises a solvent containing nitrogen as a main solvent, and wherein step (C) is performed after step (B) is completed.

53. The electronic-device manufacturing method according to any one of claims 50 to 52, wherein the liquid is applied to the substrate by an ink jet method.

54. A method of producing a flat panel display comprising a plurality of electronic-devices, said method comprising the steps of:
   (A) preparing a liquid containing a platinum-group element for constituting the electronic-device;
   (B) applying the liquid to a substrate, wherein the liquid comprises a solvent containing nitrogen as a main solvent and wherein the solvent containing nitrogen is present in the liquid in an amounts of 50 wt. % or more.

55. A method of producing a flat panel display comprising a plurality of electronic-devices, said method comprising the steps of:
   (A) preparing a substrate;
   (B) bringing a solution containing polysiloxane or a solution containing an organic silicon compound and an acid into contact with the substrate; and
   (C) applying a liquid containing a material for constituting the electronic-device to the substrate,
   wherein the liquid comprises a solvent containing nitrogen as a main solvent, and wherein step (C) is performed after step (B) is completed.

56. A method of producing a flat panel display comprising a plurality of electronic-devices, said method comprising the steps of:
   (A) preparing a substrate;
   (B) controlling a contact angle of a surface of the substrate for water to 70° or more; and
   (C) applying a liquid containing a material for constituting the electronic-device to the substrate,
   wherein the liquid comprises a solvent containing nitrogen as a main solvent, and wherein step (C) is performed after step (B) is completed.

57. The flat panel display manufacturing method according to any one of claims 54 to 56, wherein the liquid is applied to the substrate by an ink jet method.

* * * * *

UNITED STATES PATENT AND TRADEMARK OFFICE
CERTIFICATE OF CORRECTION

PATENT NO.    : 6,737,287 B1
DATED         : May 18, 2004
INVENTOR(S)   : Tsuyoshi Furuse et al.

It is certified that error appears in the above-identified patent and that said Letters Patent is hereby corrected as shown below:

Column 1,
Line 25, "Advance" should read -- Advances --;
Line 42, "{M. Harwell" should read -- {M. Hartwell --; and
Line 66, "each" should read -- to each --.

Column 3,
Lines 2, 14 and 32, "each" should read -- to each --.

Column 6,
Line 23, "200" should read -- 200 Å --; and
Line 25, "20" should read -- 20 Å --.

Column 7,
Line 23, "methylhdrogen" should read -- methylhydrogen --; and
Line 48, "capable" should read -- is capable --.

Column 8,
Line 32, "polymerlization" should read -- polymerization --.

Column 9,
Line 39, "N-methyl-2-pyrolidone," should read -- N-methyl-2-pyrrolidone, --.

Column 10,
Line 6, "determined" should read -- determine --.

Column 13,
Line 34, "slda" should read -- soda --.

Column 14,
Line 15, "N-methyl-2-pyrolidone" should read -- N-methyl-2-pyrrolidone -- and "upplied" should read -- applied --; and
Line 17, "the in" should read -- in the --.

Column 16,
Line 15, "(N-methylpyrolidone)" should read -- (N-methylpyrrolidone) --.

Column 18,
Line 50, "(N-methylpyrolidone)" should read -- (N-methylpyrrolidone)--.

Column 22,
Line 28, "a" should read -- an --.

UNITED STATES PATENT AND TRADEMARK OFFICE
CERTIFICATE OF CORRECTION

PATENT NO. : 6,737,287 B1
DATED : May 18, 2004
INVENTOR(S) : Tsuyoshi Furuse et al.

It is certified that error appears in the above-identified patent and that said Letters Patent is hereby corrected as shown below:

Column 25,
Line 7, "glass substrate 31" should read -- glass substrate 57 --;
Line 58, "metal back 19" should read -- metal back 55 --; and
Line 66, "N-methyl-2-pyrolidone" should read -- N-methyl-2-pyrrolidone --.

Column 26,
Lines 4 and 22, "N-methyl-2-plyrolidone" should read -- N-methyl-2-pyrrolidone --;
Line 65, "elected" should read -- eject --; and
Line 66, "election" should read -- ejection --.

Column 27,
Line 32, "filer" should read -- filter --; and
Line 46, "observe" should read -- observed --.

Column 30,
Line 12, "envelop 101." should read -- envelope 101. --.

Column 31,
Line 30, "is" should read -- has been -- and "uses" should read -- comprises --; and
Line 42, "N-methyl-2-pyrolidone," should read -- N-methyl-2-pyrrolidone, --.

Column 32,
Line 2, "is" should read -- has been --; and
Line 32, "pyrolidone," should read -- pyrrolidone, --.

Column 33,
Line 33, "aminoalkoxy-denatured" should read -- amino-alkoxy-denatured --; and
Line 48, "substrate;" should read -- glass substrate; --.

Column 34,
Lines 9, 18, 23 and 26, "conductive film" should read -- conductive-film --; and
Line 43, "is" should read -- has been --.

Column 35,
Line 14, "electronic-device;" should read -- electronic-device; and --.

UNITED STATES PATENT AND TRADEMARK OFFICE
CERTIFICATE OF CORRECTION

PATENT NO. : 6,737,287 B1
DATED : May 18, 2004
INVENTOR(S) : Tsuyoshi Furuse et al.

It is certified that error appears in the above-identified patent and that said Letters Patent is hereby corrected as shown below:

<u>Column 36,</u>
Line 8, "electronic-device;" should read -- electronic-device; and --.
Line 12, "amounts" should read -- amount --.

Signed and Sealed this

Twenty-first Day of September, 2004

JON W. DUDAS
*Director of the United States Patent and Trademark Office*

UNITED STATES PATENT AND TRADEMARK OFFICE
CERTIFICATE OF CORRECTION

PATENT NO. : 6,737,287 B1
DATED : May 18, 2004
INVENTOR(S) : Tsuyoshi Furuse et al.

It is certified that error appears in the above-identified patent and that said Letters Patent is hereby corrected as shown below:

<u>Title page,</u>
Item [30], Foreign Application Priority Data, "January 16, 2000 (JP)" should read
-- January 26, 2000 (JP) --

Signed and Sealed this

Eighth Day of March, 2005

JON W. DUDAS
*Director of the United States Patent and Trademark Office*